US011004864B2

(12) United States Patent
Choi et al.

(10) Patent No.: US 11,004,864 B2
(45) Date of Patent: May 11, 2021

(54) SEMICONDUCTOR DEVICE

(71) Applicant: SK hynix Inc., Icheon-si (KR)

(72) Inventors: Hyeok Jun Choi, Cheongju-si (KR); Jun Yeong Hwang, Cheongju-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/560,735

(22) Filed: Sep. 4, 2019

(65) Prior Publication Data

US 2020/0258901 A1 Aug. 13, 2020

(30) Foreign Application Priority Data

Feb. 13, 2019 (KR) ........................ 10-2019-0016859

(51) Int. Cl.
*H01L 27/11582* (2017.01)
*H01L 27/1157* (2017.01)
*H01L 27/11573* (2017.01)
*H01L 27/11565* (2017.01)

(52) U.S. Cl.
CPC .... *H01L 27/11582* (2013.01); *H01L 27/1157* (2013.01); *H01L 27/11565* (2013.01); *H01L 27/11573* (2013.01)

(58) Field of Classification Search
CPC ......... H01L 27/11582; H01L 27/11565; H01L 27/11573
USPC .......................................................... 257/324
See application file for complete search history.

(56) References Cited

U.S. PATENT DOCUMENTS 9,646,981 B2 * 5/2017 Nishikawa ......... G11C 16/0483
9,672,917 B1 * 6/2017 Costa ................. G11C 16/0483
10,256,247 B1 * 4/2019 Kanakamedala ............................ H01L 21/28097
2016/0079185 A1 * 3/2016 Kato .................. H01L 23/5226 257/314
2016/0365352 A1 * 12/2016 Nishikawa ........ H01L 21/32055
2017/0077127 A1 * 3/2017 Noda ................ H01L 27/11582
2018/0053780 A1 * 2/2018 Oh ...................... H01L 29/1037

FOREIGN PATENT DOCUMENTS

KR 1020140137632 A 12/2014
KR 1020160028087 A 3/2016
KR 101773044 B1 9/2017
KR 1020180020810 A 2/2018
KR 1020180026211 A 3/2018

* cited by examiner

*Primary Examiner* — Igwe U Anya
(74) *Attorney, Agent, or Firm* — William Park & Associates Ltd.

(57) ABSTRACT

A semiconductor device includes a stack structure including alternately stacked interlayer insulating layers and electrode patterns. The semiconductor device also includes a plurality of contact plugs connected to the electrode patterns. The semiconductor device further includes a supporting structure penetrating the stack structure between two adjacent contact plugs of the plurality of contact plugs, wherein the supporting structure has a cross section extending in a zigzag shape.

17 Claims, 18 Drawing Sheets

SEMICONDUCTOR DEVICE

CROSS-REFERENCE TO RELATED APPLICATION

The present application claims priority under 35 U.S.C. § 119(a) to Korean patent application number 10-2019-0016859, filed on Feb. 13, 2019, in the Korean Intellectual Property Office, the entire disclosure of which is incorporated herein by reference.

BACKGROUND

1. Technical Field

The present disclosure generally relates to a semiconductor device, and more particularly, to a three-dimensional semiconductor device.

2. Related Art

A semiconductor device may include a memory cell array including a plurality of memory cells. The memory cell array may include memory cells arranged in various structures. In order to improve the degree of integration of the semiconductor device, a three-dimensional semiconductor device including three-dimensionally arranged memory cells has been proposed. The three-dimensional semiconductor device may include a stack structure including electrode patterns stacked to be spaced apart from each other and a channel structure extending in the stacking direction of the electrode patterns. The memory cells may be defined at intersection portions of the electrode patterns and the channel structure.

In order to improve the degree of integration of the above-described three-dimensional semiconductor device, the stacking number of electrode patterns may be increased. As the height of the stack structure is increased, however, stably supporting the stack structure becomes an issue.

SUMMARY

In accordance with an embodiment of the present disclosure, a semiconductor device includes a stack structure including alternately stacked interlayer insulating layers and electrode patterns. The semiconductor device also includes a plurality of contact plugs connected to the electrode patterns. The semiconductor device further includes a supporting structure penetrating the stack structure between two adjacent contact plugs of the plurality of contact plugs, wherein the supporting structure has a cross section extending in a zigzag shape.

In accordance with another embodiment of the present disclosure, a semiconductor device includes a stack structure having alternately stacked interlayer insulating layers and electrode patterns. The semiconductor device also includes a supporting structure penetrating the stack structure, wherein the supporting structure has a bent part. The semiconductor device further includes a contact plug connected to one of the electrode patterns, wherein the contact plug is partially surrounded by the bent part. For some embodiments, the supporting structure may be formed in an "H" shape or an "X" shape.

For a number of embodiments, the supporting structure may comprising a first material layer penetrating the stack structure and a second material layer surrounded by the first material layer. The first material layer and the second material layer may have different tensile strengths and may have different compressive strengths.

BRIEF DESCRIPTION OF THE DRAWINGS

Example embodiments are described hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present.

DETAILED DESCRIPTION

The specific structural or functional description disclosed herein is merely illustrative for the purpose of describing embodiments according to the concept of the present disclosure. The embodiments according to the concept of the present disclosure can be implemented in various forms and should not be construed as being limited to the embodiments set forth herein.

Terms such as "first" and "second" may be used to describe various components, such components should not be understood as being limited to the above terms. The above terms are used to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present.

It should be understood that the phrase "at least one of A and B" includes A alone, B alone, and both A and B together in different embodiments.

The terms used in the present application are merely used to describe particular embodiments and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Various embodiments provide for a semiconductor device having improved structural stability.

Figure 1A:
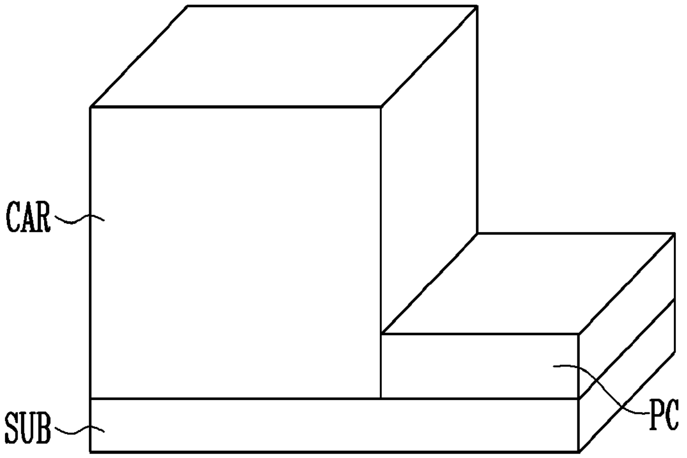
FIGS. 1A and 1B are block diagrams schematically illustrating semiconductor devices in accordance with embodiments of the present disclosure.
Figure 1B:
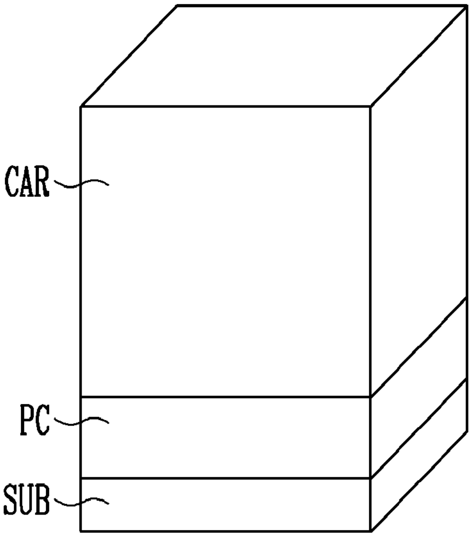

FIGS. 1A and 1B are block diagrams schematically illustrating semiconductor devices in accordance with embodiments of the present disclosure.

Referring to FIGS. 1A and 1B, each of the semiconductor devices may include a peripheral circuit structure PC and a cell array CAR, which are disposed on a substrate SUB.

The substrate SUB may be a single crystalline semiconductor layer. For example, the substrate SUB may be a silicon-on-insulator (SOI) substrate, a germanium substrate, germanium-on-insulator (GOI) substrate, a silicon-germanium substrate, or an epitaxial thin film formed through a selective epitaxial growth process.

The cell array CAR may include a plurality of memory blocks. Each of the memory blocks may include a plurality of cell strings. Each of the cell strings may be electrically connected to a bit line, a source line, word lines, and select lines. Each of the cell strings may include memory cells and select transistors, which are coupled in series. Each of the select lines may be used as a gate electrode of a corresponding select transistor, and each of the word lines may be used as a gate electrode of a corresponding memory cell.

The peripheral circuit structure PC may include NMOS and PMOS transistors, a resistor, and a capacitor, which are electrically connected to the cell array CAR. The NMOS and PMOS transistors, the resistor, and the capacitor may be used as elements that constitute a row decoder, a column decoder, a page buffer, and control logic.

As shown in FIG. 1A, the peripheral circuit structure PC may be disposed on a partial region of the substrate SUB, which does not overlap with the cell array CAR.

Alternatively, as shown in FIG. 1B, the peripheral structure PC may be disposed between the cell array CAR and the substrate SUB. The peripheral circuit structure PC overlaps with the cell array CAR, and thus the area of the substrate SUB occupied by the cell array CAR and the peripheral circuit structure PC can be reduced.

Figure 2:
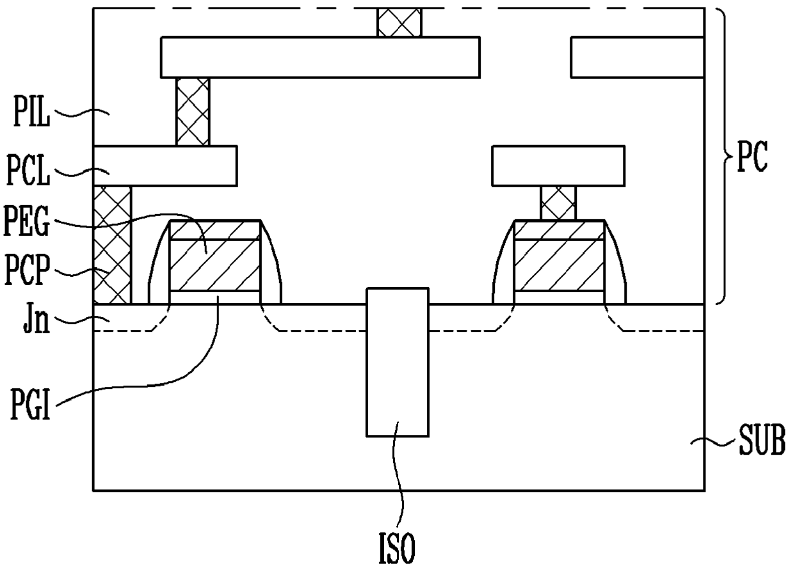
FIG. 2 is a sectional view schematically illustrating a peripheral circuit structure.

FIG. 2 is a sectional view schematically illustrating a peripheral circuit structure. The peripheral circuit structure PC shown in FIG. 2 may represent the peripheral circuit structure PC shown in FIG. 1A or the peripheral circuit structure PC shown in FIG. 1B.

Referring to FIG. 2, the peripheral circuit structure PC may include peripheral gate electrodes PEG, a peripheral gate insulating layer PGI, junctions in, peripheral circuit lines PCL, and peripheral contact plugs PCP. The peripheral circuit structure PC may be covered with a peripheral circuit insulating layer PIL formed on a substrate SUB.

The peripheral gate electrodes PEG may be used as gate electrodes of NMOS and PMOS transistors in the peripheral circuit structure PC. The peripheral gate insulating layer PGI is disposed between each of the peripheral gate electrodes PEG and the substrate SUB.

Each of the junctions in is a region defined by injecting an n-type or p-type impurity into an active region of the substrate SUB, and is disposed both sides of each of the peripheral gate electrodes PEG to be used as a source junction or drain junction. The active region of the substrate SUB may be partitioned by an isolation layer ISO formed in the substrate SUB. The isolation layer ISO is formed of an insulating material.

The peripheral circuit lines PCL may be electrically connected to transistors, a resistor, and a capacitor, which constitute a circuit of the peripheral circuit structure PC, through the peripheral contact plugs PCP.

The peripheral circuit insulating layer PIL may include insulating layers stacked in a multi-layer.

FIGS. 3A to 3E are perspective views schematically illustrating semiconductor devices in accordance with embodiments of the present disclosure. For convenience of description, interlayer insulating layers are not illustrated in FIGS. 3A to 3E.

Referring to FIGS. 3A to 3E, each of the semiconductor devices may include a plurality of memory strings CST. The memory strings CST may include memory cells and select transistors, which are arranged along channel structures CH. For example, each of the memory strings CST may include memory cells and select transistors, which are connected in series by a corresponding channel structure CH. The memory cells of each of the memory strings CST may be arranged in a three-dimensional structure so as to improve the degree of integration of the semiconductor device.

One end of each of the channel structures CH may be electrically connected to a corresponding bit line BL.

Gates of the memory cells and gates of the select transistors respectively connected to electrode patterns CP1 to CPn stacked in a first direction I to be spaced apart from each other. The electrode patterns CP1 to CPn may include word lines WL, source select lines SSL, and drain select lines DSL. The electrode patterns CP1 to CPn may be respectively disposed in a first layer to an nth layer, which are sequentially arranged in the first direction I and are spaced apart from each other. The first layer is defined as the layer disposed most distant from the bit line BL, and the nth layer is defined as the layer disposed closest to the bit line BL. Each of the electrode patterns CP1 to CPn may extend in a horizontal direction intersecting the first direction I.

Each of the electrode patterns CP1 to CPn may have a line shape extending in a direction intersecting the bit line BL. For example, the electrode patterns CP1 to CPn extend in a direction (e.g., the second direction II) that is perpendicular to a direction (e.g., the third direction III) in which the bit lines BL extend. Hereinafter, the direction in which the line shape of each of the electrode patterns CP1 to CPn extends is defined as a second direction II, and the direction in which the bit line BL extends is defined as a third direction III. The second direction II and a third direction III intersect the first direction I. For the illustrated embodiment, the first I, second II, and third III directions are all perpendicular to one another.

As shown in FIGS. 3A to 3E, the bit line BL may be connected to a corresponding channel structure CH through a drain contact plug DCT. The drain contact plug DCT may be in contact with the bit line BL and may extend toward the corresponding channel structure CH. In another embodiment, the bit line BL may be in direct contact with the channel structure CH.

Referring to FIGS. 3A to 3D, nth patterns CPn disposed in at least the nth layer among the electrode patterns CP1 to CPn may be used as the drain select lines DSL. However, the present disclosure is not limited thereto, and electrode patterns disposed in two or more adjacent layers may be used as the drain select lines DSL. In an embodiment, the nth patterns CPn disposed in the nth layer and (n−1)th patterns CPn−1 disposed in the (n−1)th layer may be used as the drain select lines DSL.

First patterns CP1 disposed in the first layer among the electrode patterns CP1 to CPn may be used as the source select lines SSL. However, the present disclosure is not limited thereto, and electrode patterns disposed in two or more adjacent layers may be used as the source select lines SSL. In an embodiment, the first patterns CP1 disposed in the first layer and second patterns CP2 disposed in the second layer may be used as the source select lines SSL.

Electrode patterns (e.g., CP3 to CPn−2) disposed between the drain select lines DSL and the source select lines SSL may be used as the word lines WL.

The electrode patterns CP1 to CPn may be separated from each other by a first slit SI1. The patterns used as the drain select lines DSL among the electrode patterns CP1 to CPn may be separated from each other in each layer by not only the first slit SI1 but also a second slit SI2. However, the present disclosure is not limited thereto. Although not shown in the drawings, in an embodiment, the patterns used as the source select lines SSL among the electrode patterns CP1 to CPn may be separated from each other in each layer by not only the first slit SI1 but also a third slit (not shown).

Each of the word lines WL, the drain select lines DSL, and the source select lines SSL may surround channel structures CH of one column or more. The channel structures CH surrounded by each of the word lines WL, the drain select lines DSL, and the source select lines SSL may be arranged in a zigzag pattern.

Drain select lines DSL disposed in the same layer may be separated from each other by the first slit SI1 and the second slit SI2. Each of the word lines WL may extend to overlap with the second slit SI2. For example, of the word lines WL may extend under the second slit SI2. Channel structures CH surrounded by each of the word lines WL may be separated into two or more groups controlled by different drain select lines DSL. For example, the drain select lines DSL may include a first drain select line and a second drain select line, which are separated from each other by the second slit SI2. The channel structures CH surrounded by each of the word lines WL may be divided into a first group controlled by the first drain select line and a second group controlled by the second drain select line.

Although not shown in the drawings, source select lines disposed in the same layer may be separated from each other by not only the first slit SI1 but also the third slit (not shown). Each of the word lines WL may extend to overlap with the third slit.

In another embodiment, the second slit SI2 may be omitted, and the drain select lines DSL disposed in the same layer may be separated from each other by the first slit SU, like the word lines WL. A number of channel structures CH surrounded by each of the word lines WL may be equal to that of channel structures CH surrounded by each of the drain select lines DSL.

Figure 3A:
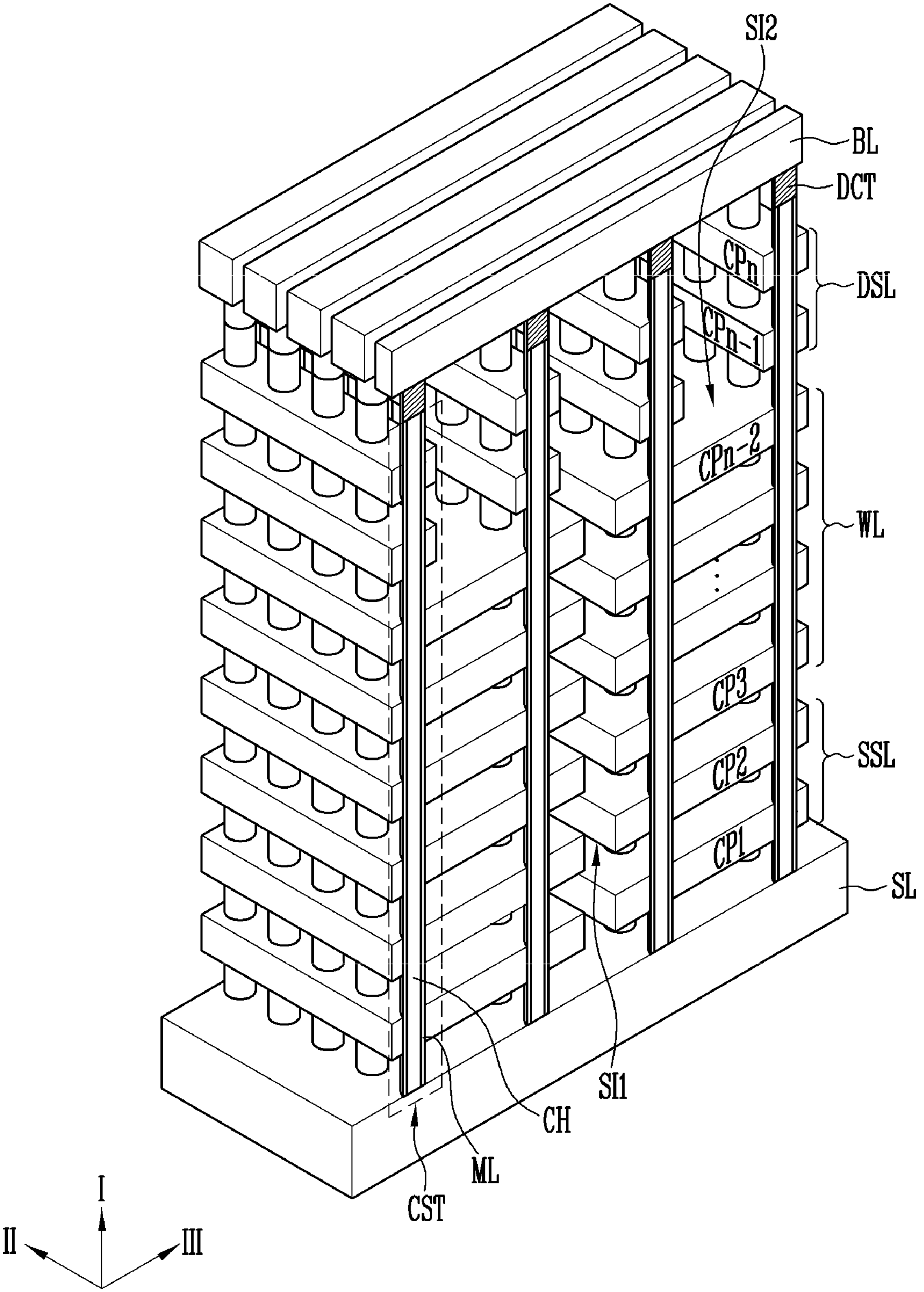
FIGS. 3A to 3E are perspective views schematically illustrating semiconductor devices in accordance with embodiments of the present disclosure.
Figure 3B:
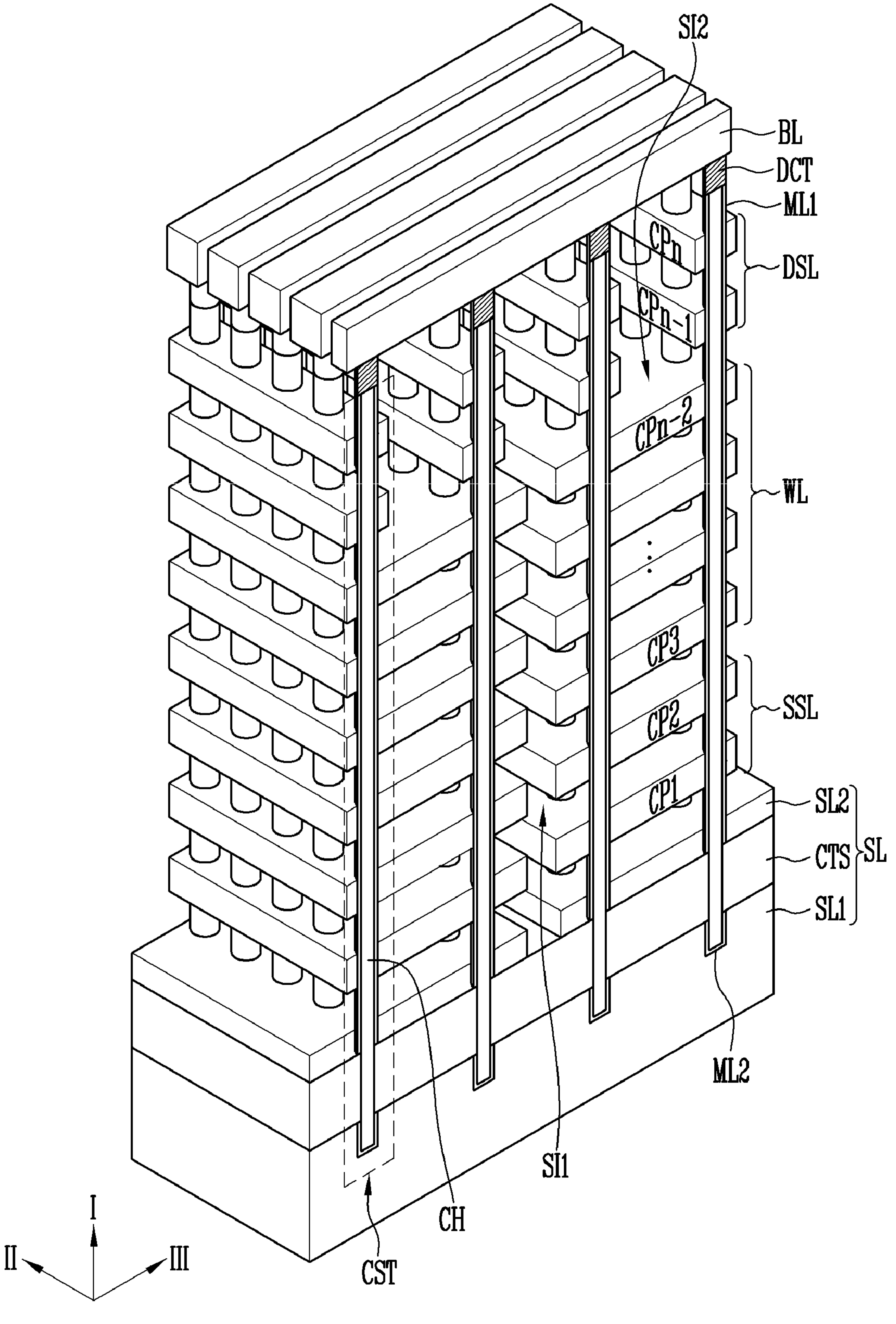
Figure 3C:
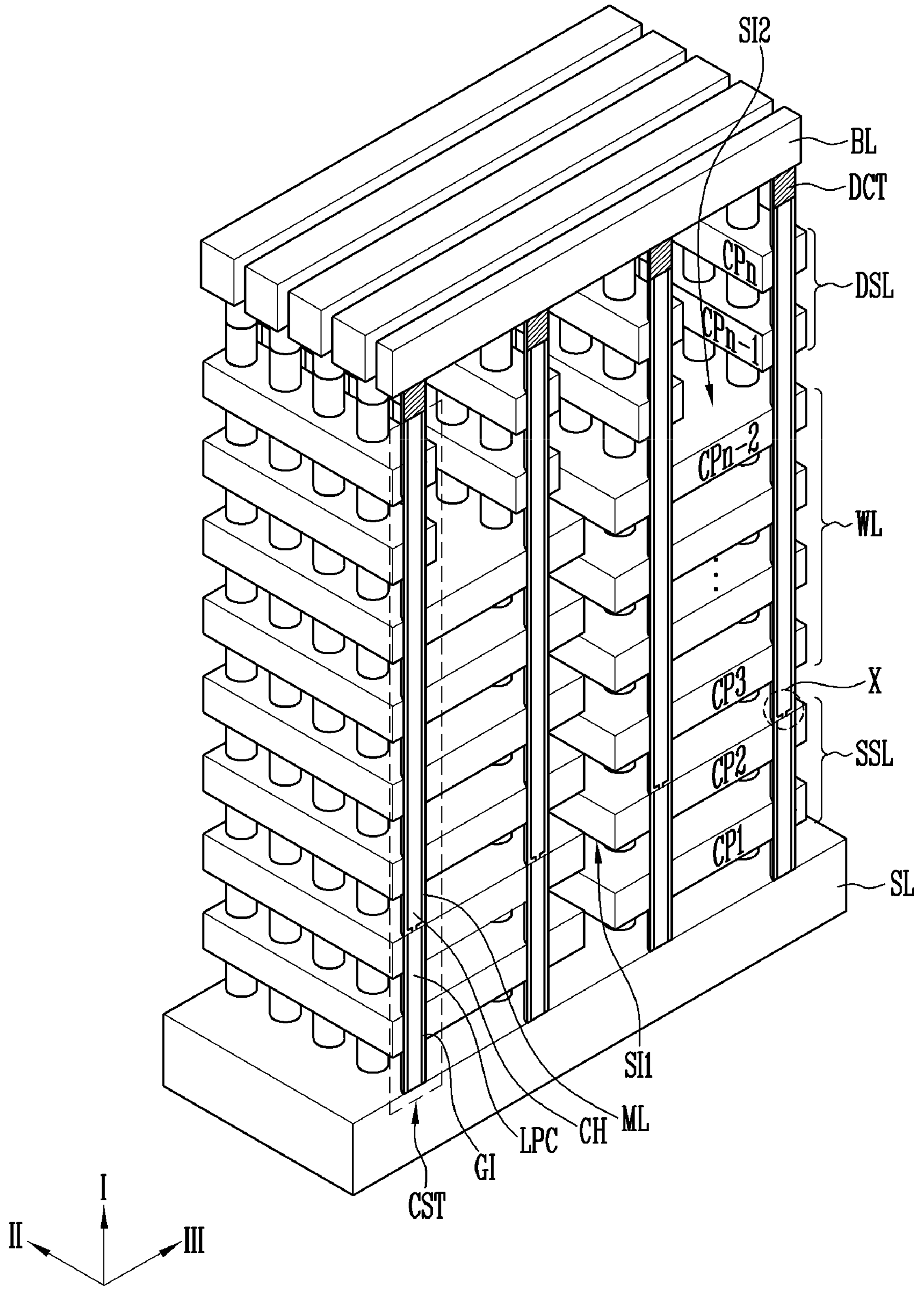
Figure 3D:
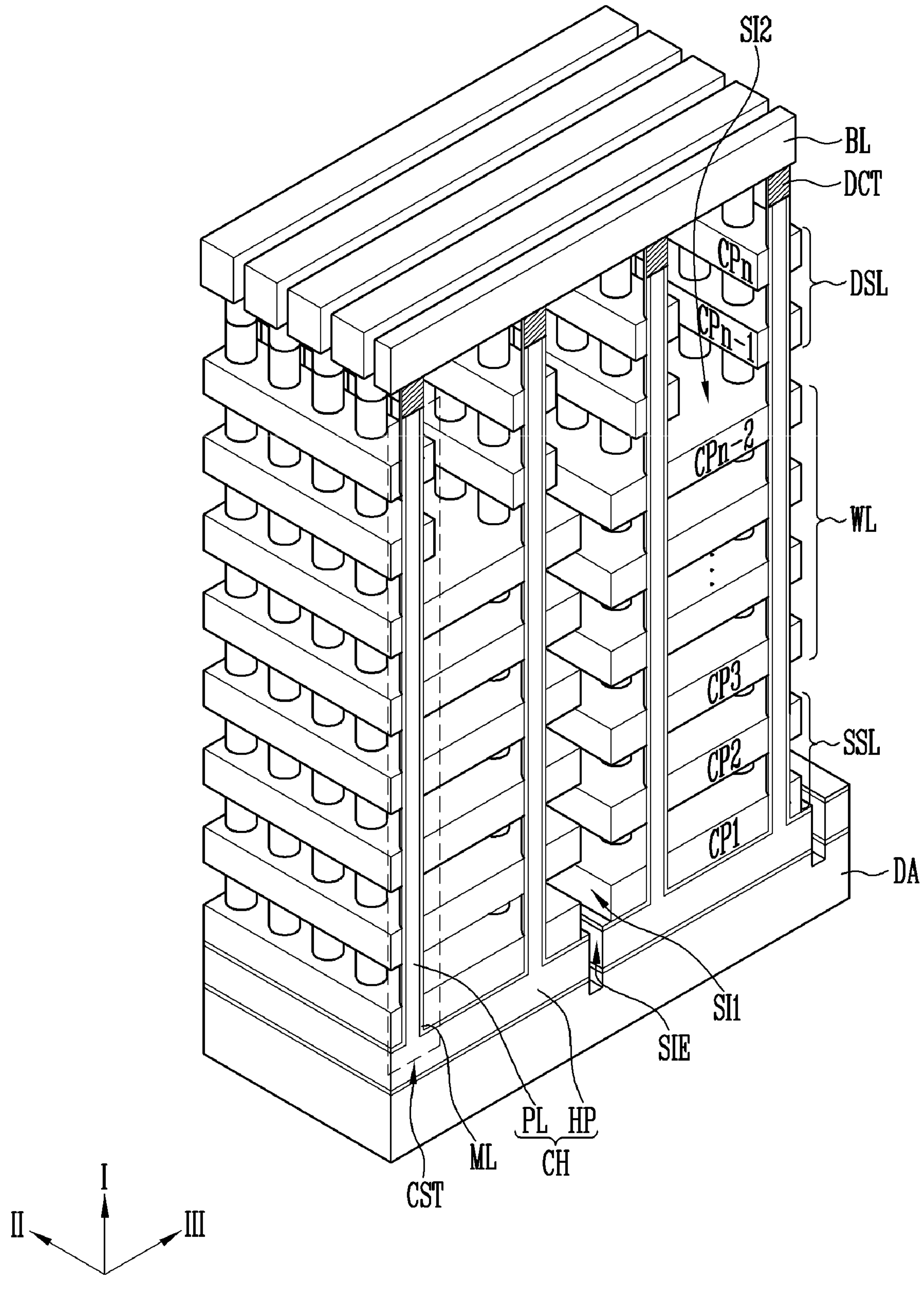

As shown in FIGS. 3A, 3B, and 3D, each of the channel structures CH may penetrate the drain select lines DSL, the word lines WL, and the source select lines SSL. In another embodiment, as shown in FIG. 3C, each of the channel structures CH may penetrate the drain select lines DSL and the word lines WL, and be connected to a lower channel structure LPC penetrating the source select lines SSL.

Referring to FIGS. 3A and 3B, the channel structures CH may be directly connected to a source layer SL disposed under the electrode patterns CP1 to CPn. The source layer SL may be formed in various structures.

In an embodiment, referring to FIG. 3A, the source layer SL may be in contact with a bottom surface of each of the channel structures CH. The source layer SL may be formed of a doped semiconductor layer including a source dopant. The source dopant may include an n-type impurity. In an embodiment, the source layer SL may be formed by injecting the source dopant toward the inside of the substrate SUB described with reference to FIG. 1A from a surface of the substrate SUB. In another embodiment, the source layer SL may be formed by depositing the doped semiconductor layer on the substrate SUB described with reference to FIG. 1B. An insulating layer may be disposed between the substrate SUB and the doped semiconductor layer. In an embodiment, the doped semiconductor layer may include doped silicon.

Continuously, referring to FIG. 3A, each of the channel structures CH may be in contact with a top surface of the source layer SL, penetrate the electrode patterns CP1 to CPn, and extend in the first direction I toward the bit line BL. A sidewall of each of the channel structures CH may be surrounded by a multi-layer ML. The multi-layer ML may extend along the sidewall of a corresponding channel structure CH. A top surface and a bottom surface of each of the channel structures CH might not blocked by the multi-layer but may be opened.

Referring to FIG. 3B, the channel structures CH may penetrate the electrode patterns CP1 to CPn and extend to the inside of the source layer SL. The sidewall of each of the channel structures CH may be in contact with the source layer SL.

The source layer SL may include a first source layer SL1, a contact source layer CST, and a second source layer SL2. The channel structures CH may penetrate the second source layer SL2 and the contact source layer CTS, and extend to the inside of the first source layer SL1. The second source layer SL2 may be omitted in some embodiments.

The first source layer SL1 may surround a lower end of each of the channel structures CH. The first source layer SL1 may be formed of a doped semiconductor layer including a source dopant. The source dopant may include an n-type impurity. The first source layer SL1 may be formed of the same material as the source layer described with reference to FIG. 3A.

The contact source layer CTS may be disposed on the first source layer SL1, and be in contact with the top surface of the first source layer SL1. The contact source layer CTS is in contact with the sidewall of each of the channel structures CH, and surrounds the channel structures CH.

Continuously, referring to FIG. 3B, the multi-layer extending along the sidewall of each of the channel structures CH may be separated into a first multi-layer pattern ML1 and a second multi-layer pattern ML2. The first multi-layer pattern ML1 is defined as a pattern surrounding an upper end of each of the channel structures CH, and the second multi-layer pattern is defined as a pattern disposed between the first source layer SL1 and a lower end of each of the channel structures CH.

The second source layer SL2 may be disposed between the contact source layer CTS and the source select line SSL. The second source layer SL2 may be formed to surround the first multi-layer pattern ML1. The second source layer SL2 may be penetrated by the first slit SI1.

Both the contact source layer CTS and the second source layer SL2 may be formed of a doped semiconductor layer including a source dopant. The source dopant may include an n-type impurity. In an embodiment, the doped semiconductor layer may include a doped silicon layer.

Figure 4:
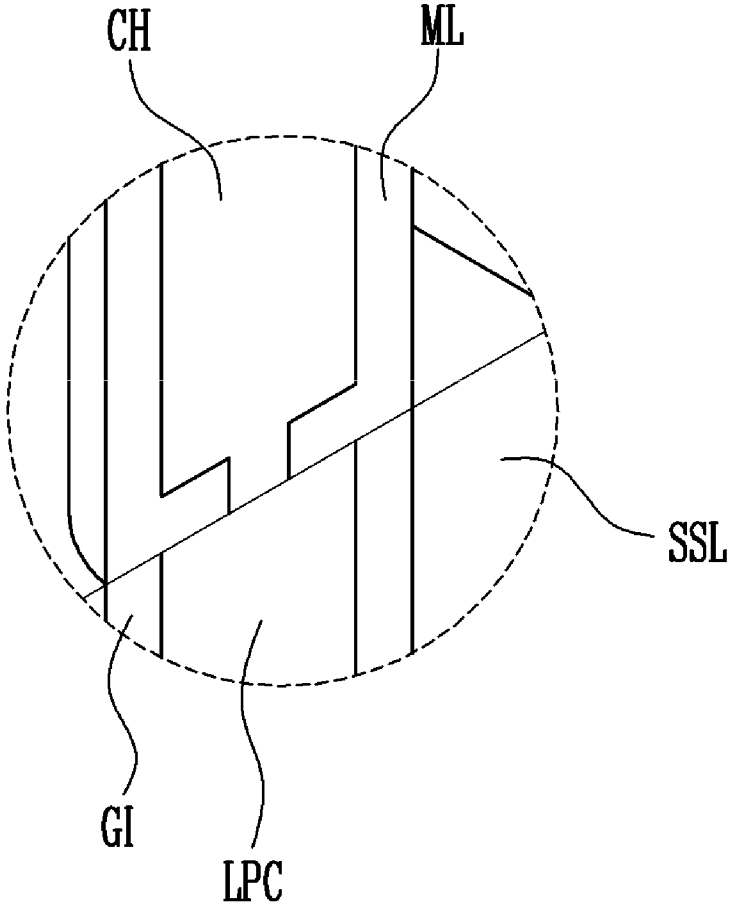
FIG. 4 is an enlarged view of region X shown in FIG. 3C.

FIG. 4 is an enlarged view of region X shown in FIG. 3C.

Referring to FIGS. 3C and 4, each of the channel structures CH may be connected to a corresponding lower channel structure LPC.

The lower channel structure LPC is connected to the corresponding channel structure CH. The lower channel structure LPC is disposed under the channel structure CH. Each channel structure CH may be surrounded by a multi-layer ML. The multi-layer ML may extend along a sidewall of the corresponding channel structure CH. A top surface and a bottom surface of the channel structure CH might not be blocked by the multi-layer ML and be open.

The lower channel structure LPC penetrates at least one source select line SSL disposed under the word lines WL. A sidewall of the lower channel structure LPC may be surrounded by a gate insulating layer GI. The gate insulating layer GI may extend along the sidewall of the lower channel structure LPC. A top surface and a bottom surface of the lower channel structure LPC might not be blocked by the gate insulating layer GI and be open.

The source layer SL may be in contact with the bottom surface of the lower channel structure LPC. The source layer SL may be formed of the same material as the source layer SL described with reference to FIG. 3A.

Referring to FIG. 3D, each of the channel structures CH may include a pillar part PL penetrating the electrode patterns CP1 to CPn and a horizontal part HP extending in the horizontal direction from the pillar part PL. A single horizontal part may connect multiple pillar parts, as shown. The horizontal parts HP of the channel structures CH may extend along lower surfaces of the first patterns CP1. The horizontal parts HP may be separated from each other by a slit extension part SIE extending from the first slit SI1. A doped region DA may be disposed under the horizontal parts HP. In other words, the horizontal parts HP may be disposed between the doped region DA and the first pattern CP1.

In an embodiment, the doped region DA may be formed of a doped semiconductor layer including a well dopant. The well dopant may include a p-type impurity. In an embodiment, the doped region DA may be formed by injecting the well dopant to a partial thickness from the surface of the substrate SUB described with reference FIG. 1A. In an embodiment, the doped region DA may be formed by depositing the doped semiconductor layer on the substrate SUB described with reference to FIG. 1B. An insulating layer may be disposed between the substrate SUB and the doped semiconductor layer. In an embodiment, the doped semiconductor layer may include doped silicon.

A sidewall of each of the pillar parts PL may be surrounded by the multi-layer ML. The multi-layer ML may extend between a corresponding horizontal part HP and the first pattern CP1. The multi-layer ML may extend between a corresponding horizontal part HP and the doped region DA.

Figure 3E:
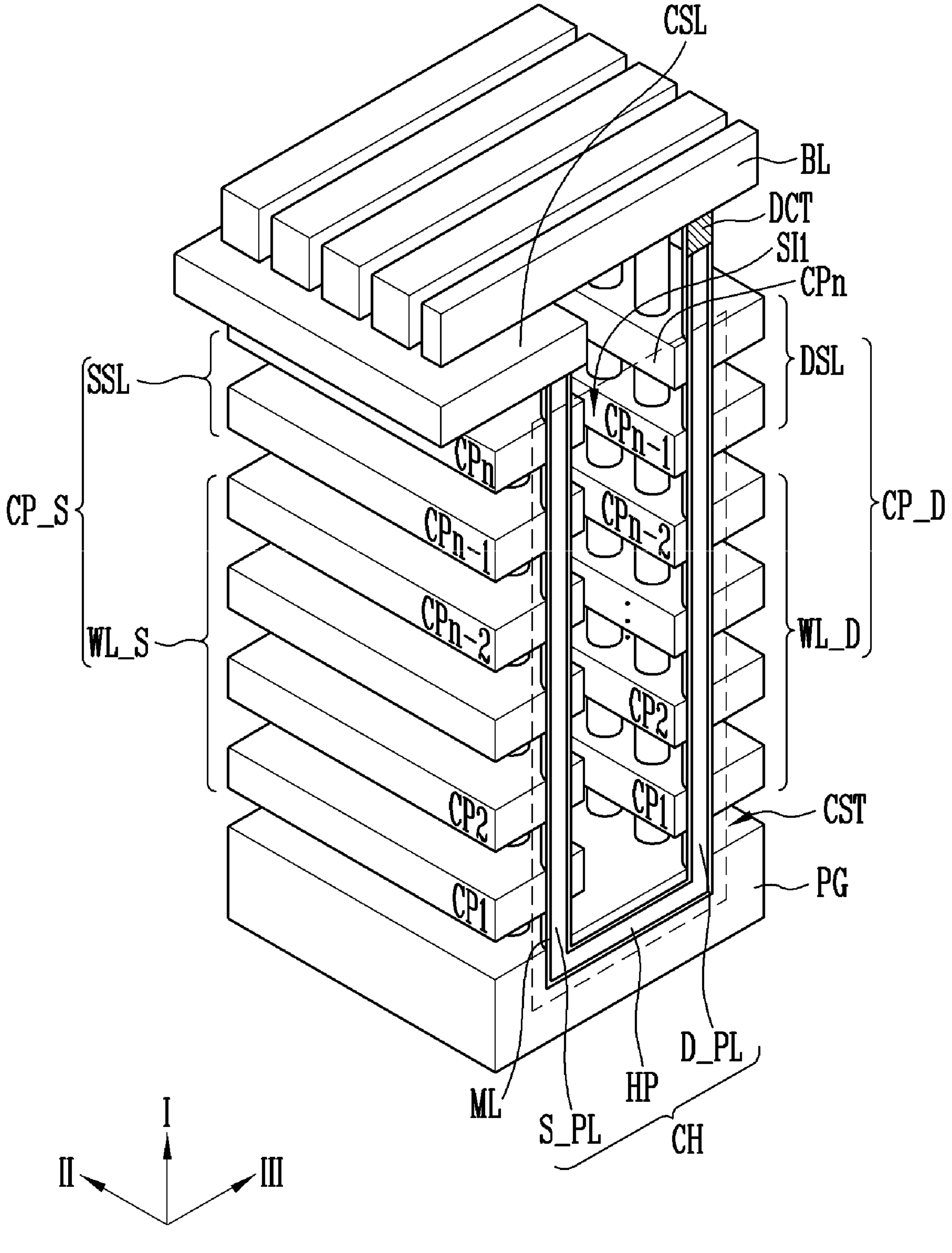

Referring to FIG. 3E, the electrode patterns CP1 to CPn may be divided into a source-side electrode patterns CP_S and drain-side electrode patterns CP_D by the first slit SI1.

A source-side nth pattern CPn disposed at least the nth layer among the source-side electrode patterns CP_S may be used as a source select line SSL. However, the present disclosure is not limited thereto, and each of electrode patterns disposed in two or more adjacent layers may be used as the source select line SSL. In an embodiment, each of the source-side nth pattern CPn and a source-side (n−1)th pattern CPn−1, which are respectively disposed in the nth layer and the (n−1)th layer, may be used as the source select line SSL. Electrode patterns (e.g., CP1 to CPn−2) disposed under the source select line SSL among the source-side electrode patterns CP_S may be used as word lines WL_S.

A drain-side nth pattern CPn disposed at least the nth layer among the drain-side electrode patterns CP_D may be used as a drain select line DSL. However, the present disclosure is not limited thereto, and each of electrode patterns disposed in two or more adjacent layers may be used as the drain select line DSL. In an embodiment, each of the drain-side nth pattern CPn and a drain-side (n−1)th pattern CPn−1, which are respectively disposed in the nth layer and the (n−1)th layer, may be used as the drain select line DSL. Electrode patterns (e.g., CP1 to CPn−2) disposed under the drain select line DSL among the drain-side electrode patterns CP_D may be used as word lines WL_D.

A common source line CSL may be disposed on the source-side electrode patterns CP_S. The common source line CSL is disposed in a layer different from that of the bit line BL. The common source line CSL and the bit line BL are formed of a conductive material, and are spaced apart from each other. For example, the common source line CSL may be disposed between the bit line BL and the source-side electrode patterns CP_S.

Each of the channel structures CH may include a source-side pillar S_PL, a drain-side pillar D_PL, and a horizontal part HP. The drain-side pillar D_PL may be electrically connected to the bit line BL. The drain-side pillar D_PL extends to penetrate the drain-side electrode patterns CP_D, and is connected to the horizontal part HP. The source-side pillar S_PL may be electrically connected to the common source line CSL. The source-side pillar S_PL extends to penetrate the source-side electrode patterns CP_S, and is connected to the horizontal part HP. The horizontal part HP is buried in a pipe gate PG. The source-side pillar S_PL and the drain-side pillar D_PL are shown extending in the first direction I from the horizontal part HP. The pipe gate PG may be disposed under the source-side electrode patterns CP_S and the drain-side electrode patterns CP_D, and be formed to surround the horizontal part HP. The pipe gate PG may be used as a gate of a pipe transistor. The pipe transistor may electrically connect the source-side pillar S_PL and the drain-side pillar D_PL through the horizontal part HP according to a signal transmitted to the pipe gate PG.

An outer wall of each of the channel structures CH may be surrounded by a multi-layer ML. The multi-layer ML extends along an outer wall of each of the drain-side pillar D_PL, the horizontal part HP, and the source-side pillar S_PL, which constitute a corresponding channel structure.

The first slit SU is disposed between source-side electrode patterns CP_S and drain-side electrode patterns CP_D, which, as pictured, are adjacent to each other in the third direction III.

Each of the word lines WL, WL_D, and WL_S described with reference to FIGS. 3A to 3E are used as gates of memory cells, each of the drain select lines DSL is used as a gate of a drain select transistor, and each of the source select lines SSL is used as a gate of a source select transistor. Each of the multi-layer ML and the multi-layer patterns ML1 and ML2 may include a data storage layer for storing data. In addition to the data storage layer, each of the multi-layer ML and the multi-layer patterns ML1 and ML2 may include a tunnel insulating layer and a blocking insulating layer, which are disposed to face each other with the data storage layer interposed between the tunnel insulating layer and the blocking insulating layer.

Each of FIGS. 3A to 3E illustrates a memory region of the semiconductor device, in which the memory strings CST are arranged. The electrode patterns CP1 to CPn may extend in the second direction II toward a contact region from the memory region.

Figure 5:
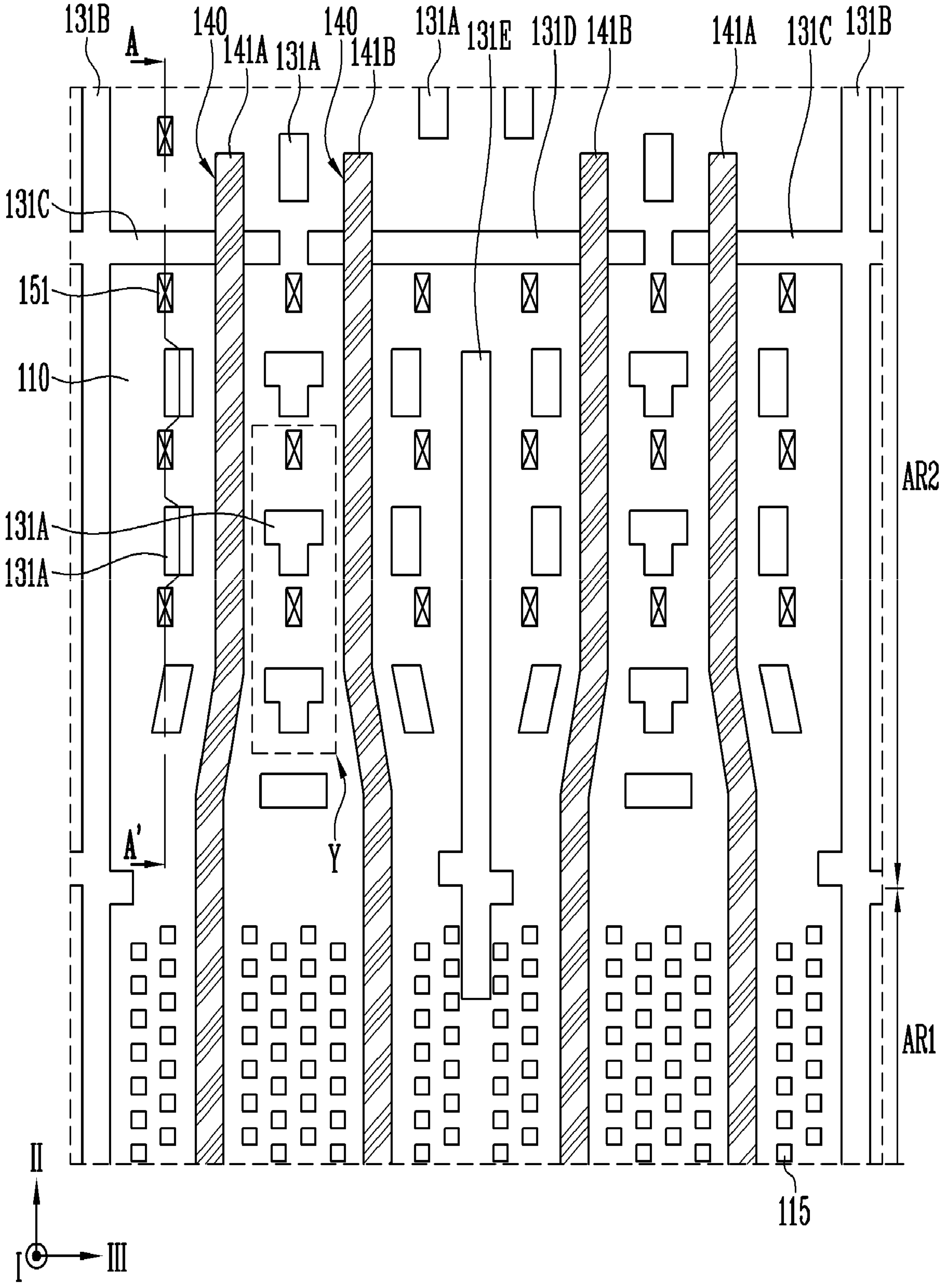
FIG. 5 is a plan view illustrating a contact region of a semiconductor device in accordance with an embodiment of the present disclosure.

FIG. 5 is a plan view illustrating a contact region of a semiconductor device in accordance with an embodiment of the present disclosure.

Referring to FIG. 5, the semiconductor device may include a stack structure including the electrode patterns CP1 to CPn described with reference to FIGS. 3A to 3E and interlayer insulating layers. The stack structure 110 may include a memory region AR1 and a contact region AR2. The memory region AR1 is a region penetrated by channel structures 115, and the contact region AR2 is a region in contact with contact plugs 151.

The channel structures 115 are arranged in zigzag fashion, as illustrated. In another embodiment, the channel structures 115 may be disposed in parallel to each other in a second direction II and a third direction III to be arranged in a matrix structure.

The stack structure 110 may be penetrated by insulating patterns 131A to 131E and vertical structures 141A and 141B. The insulating patterns 131A to 131E may include supporting structures 131A, block separation patterns 131B, first separation patterns 131C, a second separation pattern 131D, and an auxiliary pattern 131E. The vertical structures 141A and 141B fill slits 140 penetrating the stack structure 110. In an embodiment, each of the vertical structures 141A and 141B may include an insulating layer. In another embodiment, each of the vertical structures 141A and 141B may include a conductive material that fills a central region of a corresponding slit and an insulating layer that insulates between the conductive material and the stack structure 110.

The supporting structures 131A may penetrate the stack structure 110 in the contact region AR2. The supporting structures 131A disposed in the contact region AR2 may be formed in various arrangements and shapes to reinforce supporting force. For example, at least one of the supporting structures 131A may be formed in a T shape to reinforce the supporting force.

The block separation patterns 131B may define a boundary between memory blocks. The block separation patterns 131B may extend in the second direction II to penetrate the contact region AR2 from the memory region AR1. The block separation patterns 131B may extend in a first direction I, so that the stack structure 110 is separated into the memory blocks.

The first separation patterns 131C may penetrate the stack structure 110 to intersect the block separation patterns 131B. In an embodiment, the first separation patterns 131C may be spaced apart from each other in the third direction III. The first separation patterns 131C may respectively intersect the block separation patterns 131B. The second separation pattern 131D may be disposed between the first separation patterns 131C adjacent to each other in the third direction III. The second separation pattern 131D may be separated from the first separation patterns 131C. In another embodiment, the first separation patterns 131C may be connected to each other and the second separation pattern 131D may be omitted.

The slits 140 may extend to penetrate the contact region AR2 from the memory region AR1. The slits 140 may extend in parallel to each other in the memory region AR1. The slits 140 may extend in parallel to each other in the contact region AR2 with the supporting structures 131A and the contact plugs 151, which are interposed therebetween. Any one of the slits 140 may correspond to the first slit SI1 described with reference to FIGS. 3A to 3E.

The vertical structures 141A and 141B may extend to penetrate the contact region AR2 from the memory region AR1. The vertical structures 141A and 141B may be arranged between the block separation patterns 131B to be spaced apart from each other in the third direction III. The channel structures 115 may be arranged on both sides of each of the vertical structures 141A and 141B. The vertical structures 141A and 141B may include first vertical structures 141A intersecting the first separation patterns 131C and second vertical structures 141B intersecting the second separation pattern 131D. The stack structure 110 may be separated into line patterns by the first separation patterns 131C and the first vertical structures 141A connected to the first separation patterns 131C, and the second separation pattern 131D and the second vertical structures 141B connected to the second separation pattern 131D. A distance between the vertical structures 141A and 141B in the memory region AR1 may be different from that between the vertical structures 141A and 141B in the contact region AR2. For example, adjacent first and second vertical structures 141A and 141B may be formed so the distance between them is narrower in the contact region AR2 than in the memory region AR1. This may result in the distance between adjacent second vertical structures 141B in the contact region AR2 being wider than the distance between the adjacent second vertical structures 141B in the memory region AR1. The auxiliary pattern 131E may be disposed between the second vertical structures 141B in the contact region AR2. Any one of the vertical structures 141A and 141B may be a pattern filling the first slit SU described with reference to FIGS. 3A to 3E.

Figure 6:
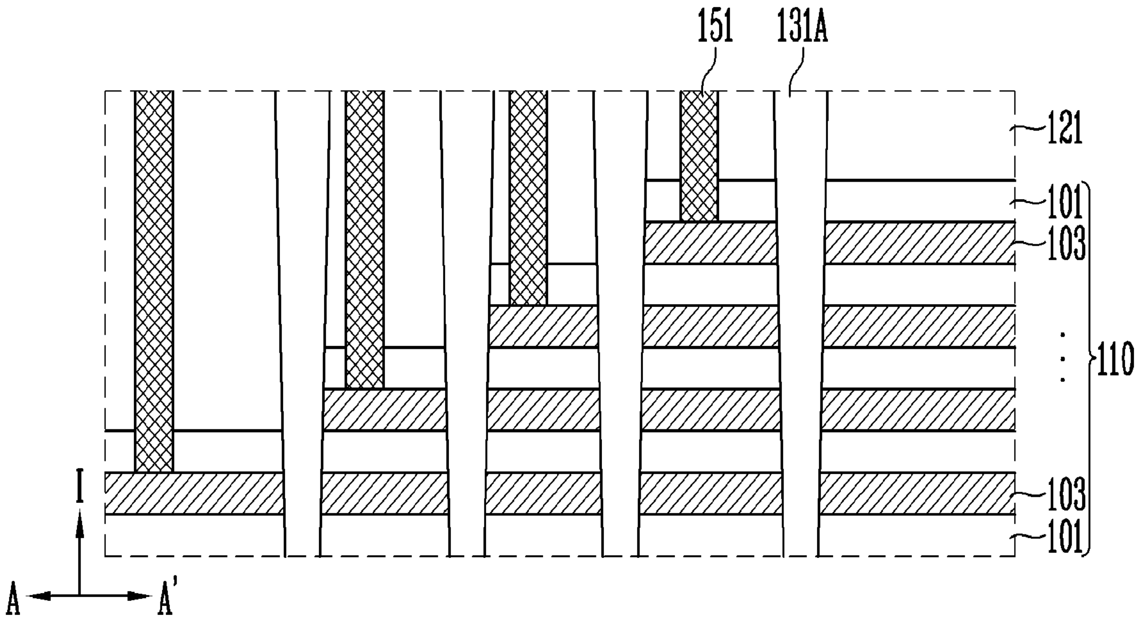
FIG. 6 illustrates a section of the semiconductor device taken along line A-A' shown in FIG. 5.

FIG. 6 illustrates a section of the semiconductor device taken along line A-A' shown in FIG. 5. Electrode patterns 103 shown in FIG. 6 may be some of the electrode patterns CP1 to CPn shown in FIGS. 3A to 3E.

Referring to FIG. 6, the stack structure 110 includes interlayer insulating layers 101 and the electrode patterns 103, which are alternately stacked in the first direction I. The stack structure 110 may include a stepped structure formed in the contact region shown in FIG. 5. A lower pattern among the electrode patterns 103 may be exposed by the stepped structure formed by the electrode patterns 103 to further protrude toward a side portion than an upper pattern among the electrode patterns 103.

Pad regions of the electrode patterns 103 exposed by the stepped structure are connected to the contact plugs 151. The contact plugs 151 may be in contact with the electrode patterns 103 and extend in the first direction I. The contact plugs 151 may penetrate the interlayer insulating layers 101.

The stack structure 110 may be covered with an upper insulating layer 121. The contact plugs 151 may extend to penetrate the upper insulating layer 121.

The supporting structures 131A may be implemented with various materials in various shapes to reinforce the supporting force and improve structural stability. Various examples of supporting structures 131A for reinforcing the supporting force in accordance with embodiments of the present disclosure are described in detail below.

FIGS. 7A to 7E, 8A to 8E, and 9A to 9E are plan views illustrating various supporting structures in accordance with embodiments of the present disclosure.

FIGS. 7A to 7E are enlarged views of region Y shown in FIG. 5. FIGS. 7A to 7E illustrate a first contact plug 151A and a second contact plug 151B, which are adjacent to each other in the second direction II among the contact plugs 151 shown in FIG. 5, and illustrate a limited number of possible variations for the supporting structure 131 shown in FIG. 5. Supporting structures 131Aa to 131Ae shown in FIGS. 7A to 7E, respectively, may be disposed between the slits 140 extending in the second direction II in the contact region AR2 shown in FIG. 5.

Figure 7A:
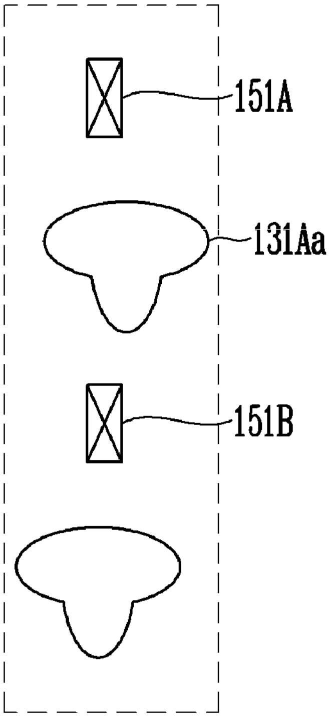
FIGS. 7A to 7E, 8A to 8E, and 9A to 9E are plan views illustrating various supporting structures in accordance with embodiments of the present disclosure.

Referring to FIG. 7A, the supporting structure 131Aa may be formed in a "T" shape. Because the supporting structure 131Aa is formed in the T shape along extension axes facing different directions, it is advantageous to reinforce the supporting force in a narrow area.

Figure 7B:
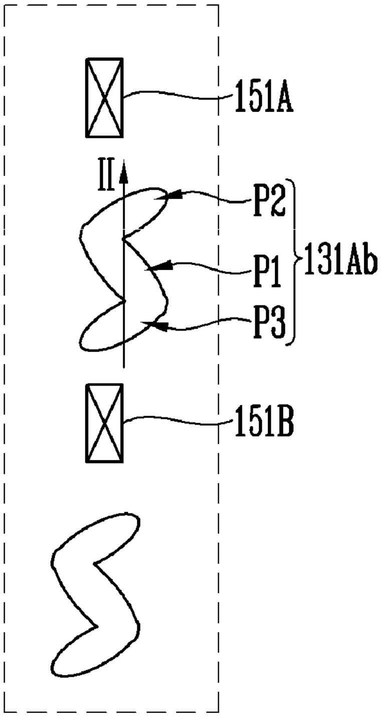

Referring to FIG. 7B, the supporting structure 131Ab may extend in a zigzag fashion or have an "S" shape. The zigzag-shaped supporting structure 131Ab may include a first part P1 and second and third parts P2 and P3 extending in opposite directions from both ends of the first part P1. The first part P1 extends in a direction obliquely intersecting with respect to the second direction II, and the second part P2 and the third part P3 extend in a direction intersecting the second direction II and the extending direction of the first part P1.

Within a limited area, the T-shaped supporting structure 131Aa shown in FIG. 7A or the zigzag-shaped supporting structure 131Ab shown in FIG. 7B may be disposed between the slits 140 shown in FIG. 5. The zigzag-shaped supporting structure 131Ab extends in a direction obliquely intersecting the direction of extension of the slits 140 shown in FIG. 5. Accordingly, an area of an electrode pattern formed between each of the slits 140 and the zigzag-shaped supporting structure 131Ab may be secured wider than that of an electrode pattern formed between each of the slits 140 and the T-shaped supporting structure 131Aa. Also, the zigzag-shaped supporting structure 131Ab may provide a stable supporting force through the shape thereof. Thus, the zig-zag-shaped supporting structure 131Ab has extension axes facing two directions, like the T-shaped supporting structure 131Aa, and hence the supporting force may be improved. Consequently, the zigzag-shaped supporting structure 131Ab may improve the supporting force and reduce resistive failure of each of the electrode patterns 103 shown in FIG. 6.

Figure 7C:
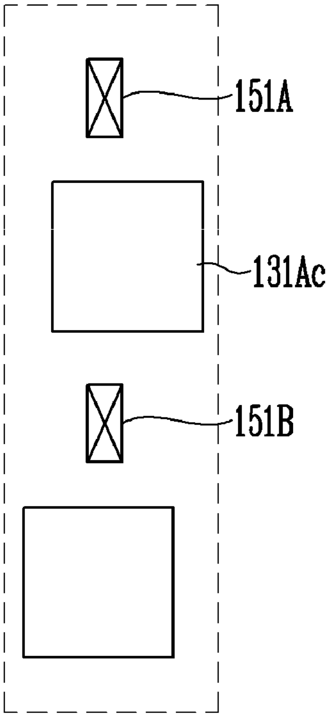

Referring to FIG. 7C, the supporting structure 131Ac is formed with an area wider than those of the supporting structures 131Aa and 131Ab shown in FIGS. 7A and 7B, to provide a stable supporting force. The supporting structure 131Ac having a wide area may have a cross-section of square shape as shown in FIG. 7C. However, the present disclosure is not limited thereto. For example, the supporting structure 131Ac may have a polygonal cross section, such as a rectangular shape, or have a circular or elliptical cross section.

Figure 7D:
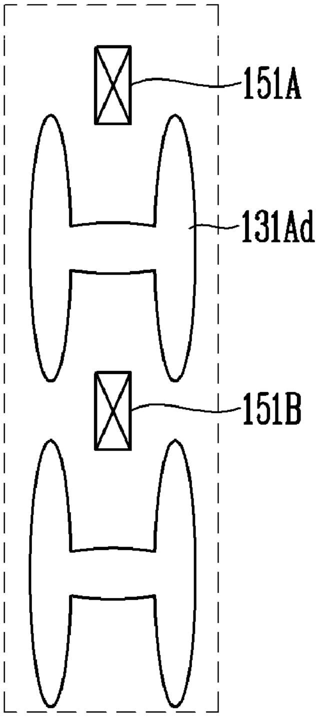
Figure 7E:
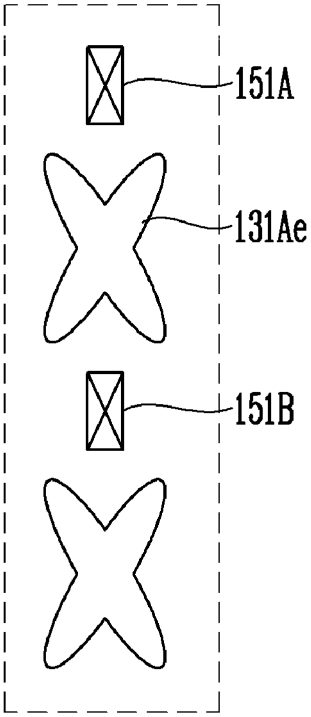
Figure 8A:
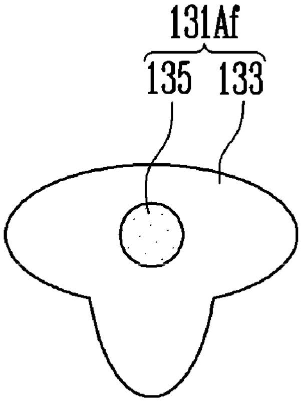
Figure 8B:
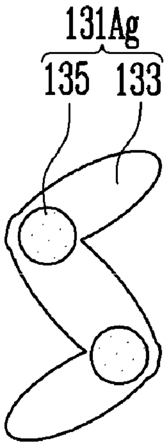
Figure 8C:
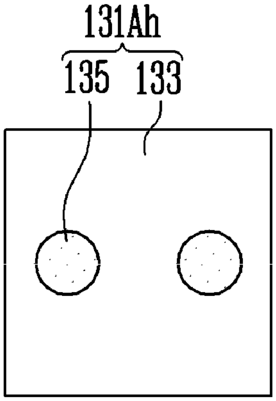
Figure 8D:
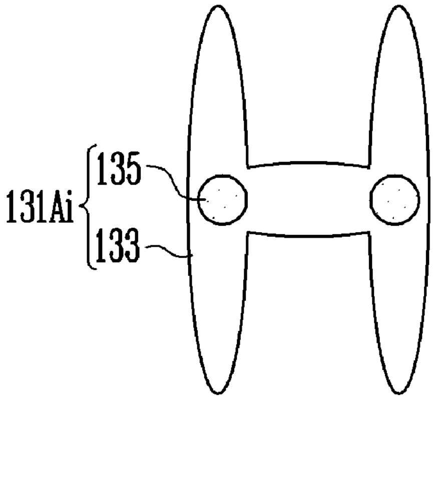
Figure 8E:
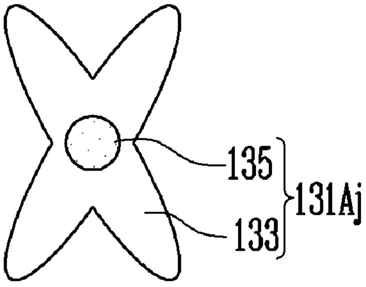
Figure 9A:
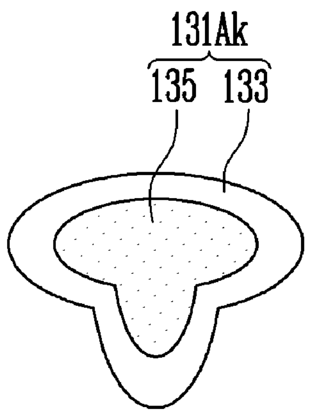
Figure 9B:
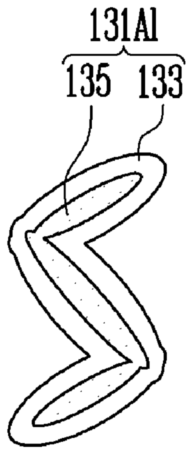
Figure 9C:
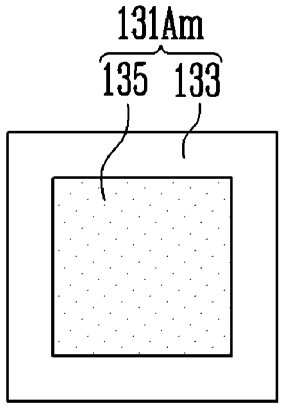
Figure 9D:
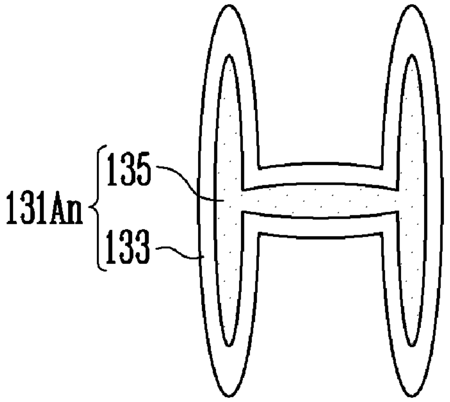
Figure 9E:
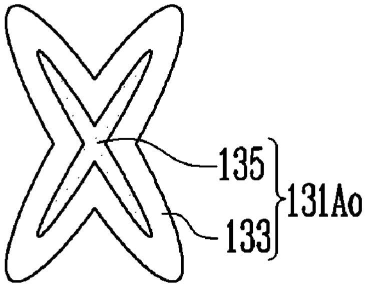

Referring to FIGS. 7D and 7E, each of the supporting structures 131Ad and 131Ae may include at least one bent part. In an embodiment, the supporting structure 131Ad may have an H-shaped cross-sectional structure including the bent part as shown in FIG. 7D. In another example, the supporting structure 131Ae may have an X-shaped cross-sectional structure including the bent part as shown in FIG. 7E.

The bent part of each of the supporting structures 131Ad and 131Ae shown in FIGS. 7D and 7E is disposed to partially surround a corresponding contact plug 151A or 151B. Thus, the supporting structures 131Ad and 131Ae having the bent part may improve the supporting force, and an alignment margin of the contact plugs 151A and 151B may be secured by a space defined by the bent part.

Each of the supporting structures 131Aa to 131Ae shown in FIGS. 7A to 7E may be formed of a single insulating material. For example, each of the supporting structures 131Aa to 131Ae shown in FIGS. 7A to 7E may be formed of silicon oxide ($SiO_2$).

FIGS. 8A to 8E and 9A to 9E are plan views illustrating modifications of the respective supporting structures shown in FIGS. 7A to 7E.

Referring to FIGS. 8A to 8E and 9A to 9E, each of supporting structures 131Af to 131Ao may include a first material layer 133 penetrating the stack structure 110 shown in FIG. 6 and a second material layer 135 surrounded by the first material layer 133.

The first material layer 133 and the second material layer 135 may have different tensile strengths and may have different compressive strengths. In an embodiment, the first material layer 133 may has tensile strength greater than that of the second material layer 135, and the second material layer 135 may have compressive strength greater than that of the first material layer 133. In another embodiment, the second material layer 135 may has tensile strength greater than that of the first material layer 133, and the first material layer 133 may have compressive strength greater than that of the second material layer 135. For example, any one of the first material layer 133 and the second material layer 135 may comprise silicon oxide ($SiO_2$), and the other of the first material layer 133 and the second material layer 135 may comprise at least one of aluminum oxide ($Al_2O_3$), silicon carbide (SiC), boron carbide ($B_4C$), and silicon nitride ($Si_3N_4$). In the embodiment of the present disclosure, the tensile strength and compressive strength of the supporting structures 131Af to 131Ao may be simultaneously improved by controlling properties of the first material layer 133 and the second material layer 135.

After a through-hole having a shape corresponding to each of the supporting structures 131Af to 131Ao is formed in the stack structure, the first material layer 133 and the second material layer 135 may be formed to fill the through-hole.

In an embodiment, the first material layer 133 may be formed to fill the through-hole, and the second material layer 135 may be formed to fill an internal hole defined in the first material layer 133. The internal hole may be formed by etching the first material layer 133. As shown in FIGS. 8A to 8E, the second material layer 135 may be disposed in the first material layer 133 to form one or more patterns. Although patterns formed by the second material layer 135 having a circular cross section are illustrated in FIGS. 8A to 8E, the present disclosure is not so limited. The position and/or cross-sectional shape of the patterns formed by the second material layer 135 may be variously modified in the first material layer 133.

In another embodiment, the first material layer 133 may be formed along the surface of the through-hole to open a central region of the through-hole, and the second material layer 135 may be formed to fill the central region of the through-hole opened by the first material layer 135. As shown in FIGS. 9A to 9E, the second material layer 135 may have a shape obtained by reducing the cross-sectional shape of a corresponding structure among the supporting structures 131Ak to 131Ao.

Figure 10A:
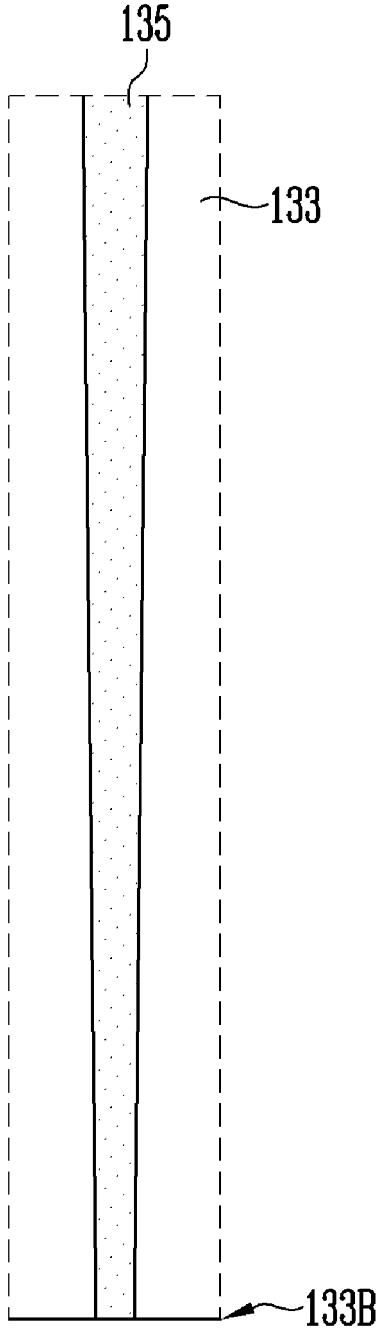
FIGS. 10A and 10B illustrate various longitudinal sections of a first material layer and a second material layer of a supporting structure in accordance with an embodiment of the present disclosure.
Figure 10B:
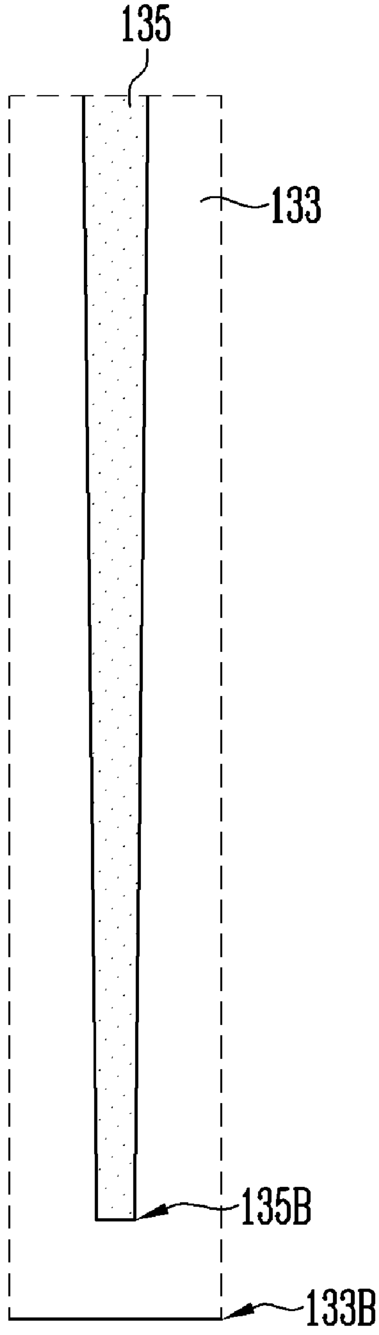

FIGS. 10A and 10B illustrate various longitudinal sections of a first material layer and a second material layer of a supporting structure in accordance with an embodiment of the present disclosure. For example, FIG. 10A illustrates a longitudinal sectional structure of each of the supporting structures 131Af to 131Aj shown in FIGS. 8A to 8E in an embodiment of the present disclosure, and FIG. 10B illustrates a longitudinal sectional structure of each of the supporting structures 131Ak to 131Ao shown in FIGS. 9A to 9E in accordance with another embodiment of the present disclosure.

Referring to FIG. 10A, a bottom surface 133B of the first material layer 133 may be penetrated by the second material layer 135.

Referring to FIG. 10B, a bottom surface of the second material layer 135 may be disposed on the bottom surface 133B of the first material layer 133. That is, the first material layer 133 may extend along the bottom surface 135B of the second material layer 135.

Figure 11A:
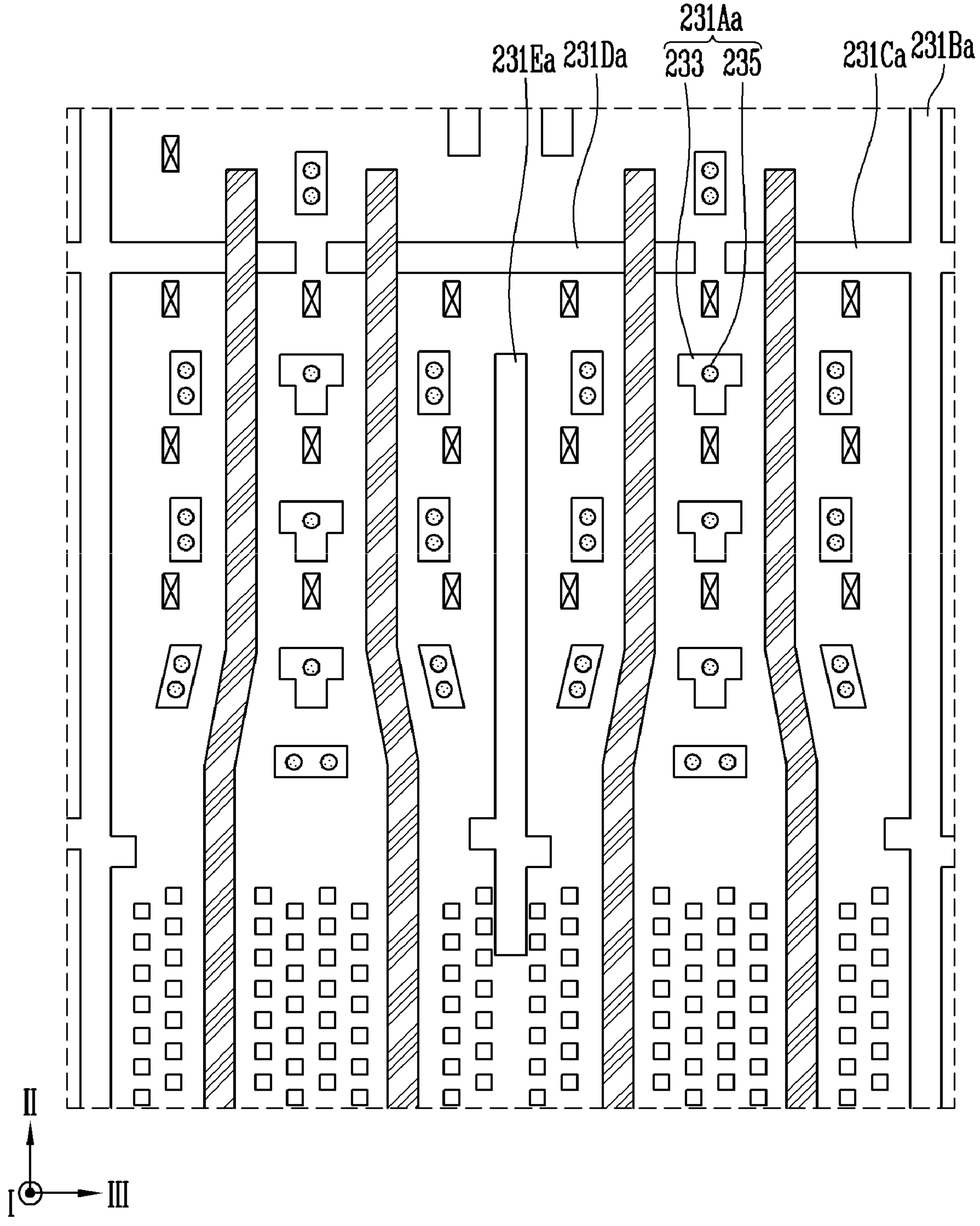
FIGS. 11A and 11B are plan views illustrating contact regions of semiconductor devices in accordance with various embodiments of the present disclosure.
Figure 11B:
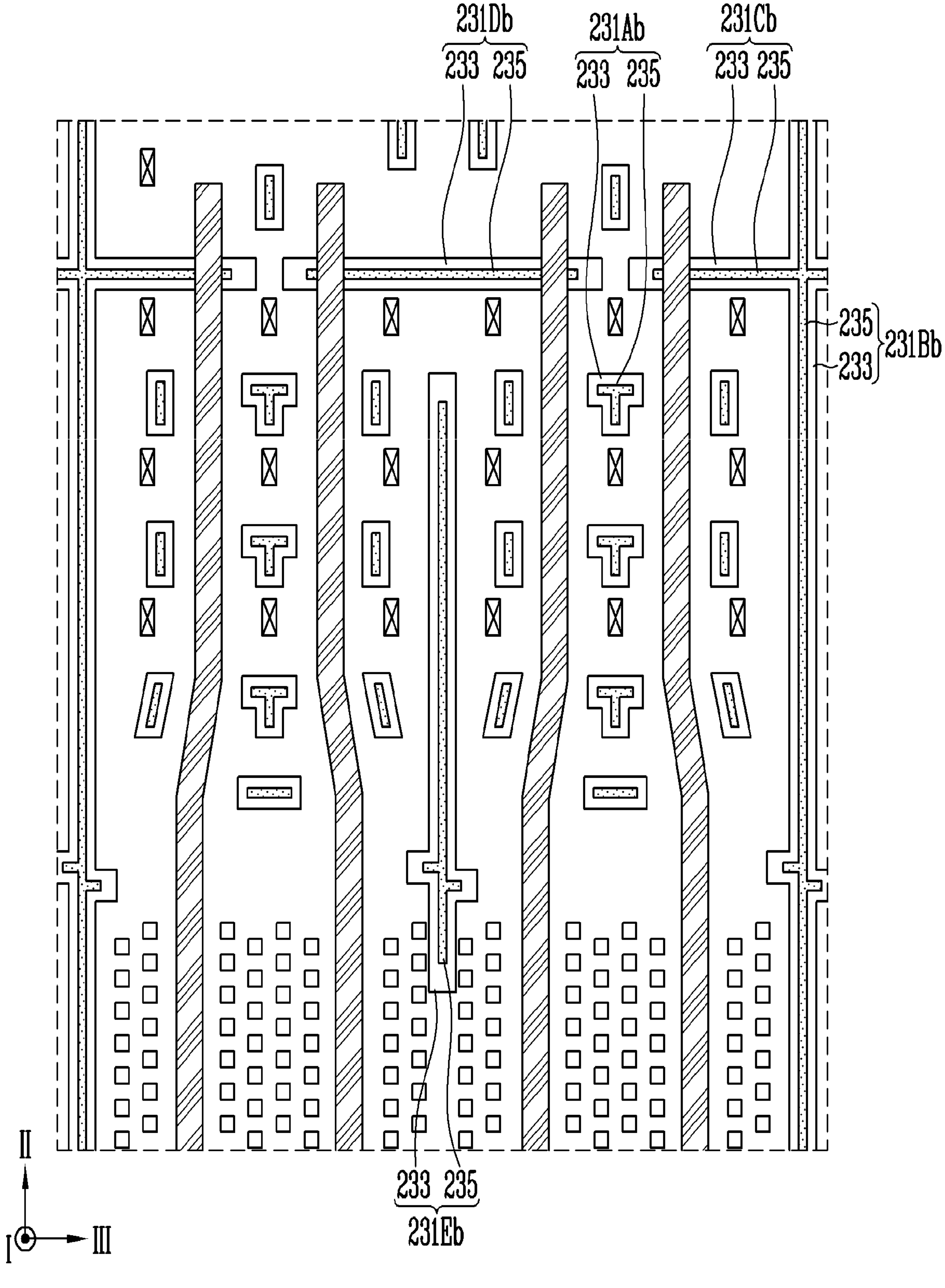

FIGS. 11A and 11B are plan views illustrating contact regions of semiconductor devices in accordance with various embodiments of the present disclosure. Hereinafter, insulating patterns 231Aa to 231Ea and 231Ab to 231Eb in accordance with modifications are described, and overlapping descriptions of components identical to those shown in FIG. 5 are omitted.

Each of the insulating patterns 231Aa to 231Ea shown in FIG. 11A and the insulating patterns 231Ab to 231Eb shown in FIG. 11B may include supporting structures 231Aa or 231Ab, block separation patterns 231Ba or 231Bb, first separation patterns 231Ca or 231Cb, a second separation pattern 231Da or 231Db, and an auxiliary pattern 231Ea or 231Eb as described with reference to FIG. 5.

Referring to FIG. 11A, the insulating patterns 231Aa to 231Ea may include at least one of the supporting structures described with reference to FIGS. 8A to 8E.

For example, each of the supporting structures 231Aa may include a first material layer 233 and a second material layer 235 surrounded by the first material layer 233. Each of the block separation patterns 231Ba, the first separation patterns 231Ca, the second separation pattern 231Da, and the auxiliary pattern 231Ea may be formed of the same material as the first material layer 233. The first material layer 233 and the second material layer 235 are identical to the first material layer 133 and the second material layer 135, which are described with reference to FIGS. 8A to 8E.

Each of the block separation patterns 231Ba, the first separation patterns 231Ca, the second separation pattern 231Da, and the auxiliary pattern 231Ea may be simultaneously formed with the first material layer 233 by using a process of forming the first material 233 of each of the supporting structures 231Aa.

The process of forming the supporting structures 231Aa may include a process of partially etching a portion of the first material layer 233 and a process of filling a region in which the first material layer 233 is etched with the second material layer 235. The disposition region of the second material layer 235 may be variously changed by the etched region of the first material layer 233. The disposition region of the second material layer 235 may be formed while avoiding the disposition regions of the block separation patterns 231Ba, the first separation patterns 231Ca, the second separation pattern 231Da, and the auxiliary pattern 231Ea as shown in FIG. 11A.

Referring to FIG. 11B, the insulating patterns 231Ab to 231Eb may include at least one of the supporting structures shown in FIGS. 9A to 9E.

For example, each of the insulating patterns 231Ab to 231Eb may include a first material layer 233 and a second material layer 235 surrounded by the first material layer 233. The first material layer 233 and the second material layer 235 are identical to the first material layer 133 and the second material layer 135, which are described with reference to FIGS. 9A to 9E. The block separation patterns 231Bb, the first separation patterns 231Cb, the second separation pattern 231Db, and the auxiliary pattern 231Eb may be simultaneously formed with the supporting structures 231Ab.

The first material layer 233 may extend along an edge of a corresponding pattern among the insulating patterns 231Ab to 231Eb. The second material layer 235 may be disposed in a central region of a corresponding pattern among the insulating patterns 231Ab to 231Eb.

Figure 12:
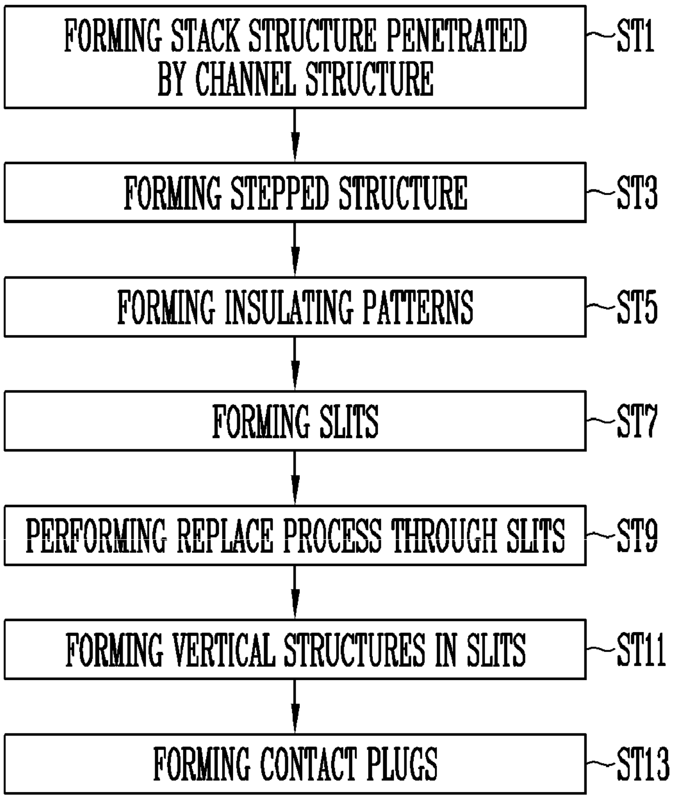
FIG. 12 is a flowchart schematically illustrating a manufacturing method of a semiconductor device in accordance with an embodiment of the present disclosure.

FIG. 12 is a flowchart schematically illustrating a manufacturing method of a semiconductor device in accordance with an embodiment of the present disclosure.

Referring to FIG. 12, a stack structure penetrated by a channel structure may be formed in process ST1. In an embodiment, the process ST1 may include a process of alternately stacking interlayer insulating layers and sacrificial layers and a process of forming a channel structure penetrating the interlayer insulating layers and the sacrificial layers. One region of the stack structure, in which the channel structure is disposed, may be defined as the memory region AR1 described with reference to FIG. 5.

In the above, the sacrificial layers may be formed of a material different from that of the interlayer insulating layers. For example, the interlayer insulating layers may be formed of an oxide, such as a silicon oxide layer. The sacrificial layers may be formed of a material having an etching rate different from that of the interlayer insulating layers. For example, the sacrificial layers may be formed of a nitride, such as a silicon nitride layer.

In the above, the process of forming the channel structure may include a process of forming channel holes penetrating the interlayer insulating layers and the sacrificial layers and a process of filling each of the channel holes with a channel structure. The channel structure may be formed of a semiconductor layer. For example, the channel structure may be formed of a silicon layer. When a central region of each of the channel holes is opened by the semiconductor layer, the central region of each of the channel holes may be filled with a core insulating layer.

Before the channel structure is formed, a multi-layer may be formed on a sidewall of each of the channel holes. The channel structure may be formed on the multi-layer. The process of forming the multi-layer may include a process of sequentially stacking a blocking insulating layer, a data storage layer, and a tunnel insulating layer toward the central region of each of the channel holes from the sidewall of the channel hole. The blocking insulating layer may include an oxide layer capable of blocking charges. The data storage layer may be formed of a charge trapping layer, be formed of a material layer including conductive nano dots, or be formed of a phase change material layer. The data storage layer may store data changed using Fowler-Nordheim tunneling. To this end, the data storage layer may be formed of a silicon nitride layer in which charges can be trapped. The data storage layer may store data based on another operating principle instead of the Fowler-Nordheim tunneling. For example, the data storage layer may be formed of a phase change material layer and store data according to a phase change. The tunnel insulating layer may be formed of a silicon oxide layer through which charges can tunnel.

After the process ST1, a stepped structure may be formed by etching the stack structure including the interlayer insulating layers and the sacrificial layers in process ST3. A partial region of the stack structure, in which the stepped structure is formed, may be defined as the contact region AR2 described with reference to FIG. 5.

Subsequently, insulating patterns penetrating the stack structure including the interlayer insulating layers and the sacrificial layers may be formed in process ST5. The insulating patterns may have various cross-sectional shapes as described with reference to FIGS. 6, 7, 7A to 7E, 8A to 8E, 9A to 9E, and 11A and 11B. Also, the insulating patterns may have various longitudinal shapes as described with reference to FIGS. 10A and 10B. Before the process ST5 is performed, an upper insulating layer covering the stepped structure may be formed.

Subsequently, slits penetrating the stack structure including the interlayer insulating layers and the sacrificial layers may be formed in process ST7. The slits correspond to the slits 140 described with reference to FIG. 5.

Subsequently, a replace process of replacing the sacrificial layers of the stack structure with electrode patterns through the slits may be performed in process ST9. The process ST9 is described in detail with reference to FIGS. 13A to 13C.

Subsequently, vertical structures filling the slits may be formed in process ST11. The vertical structures may correspond to the vertical structures 141A and 141B described with reference FIG. 5.

Subsequently, contact plugs in contact with the electrode patterns may be formed in process ST13. The contact plugs may correspond to the contact plugs 151 described with reference to FIG. 5.

Figure 13A:
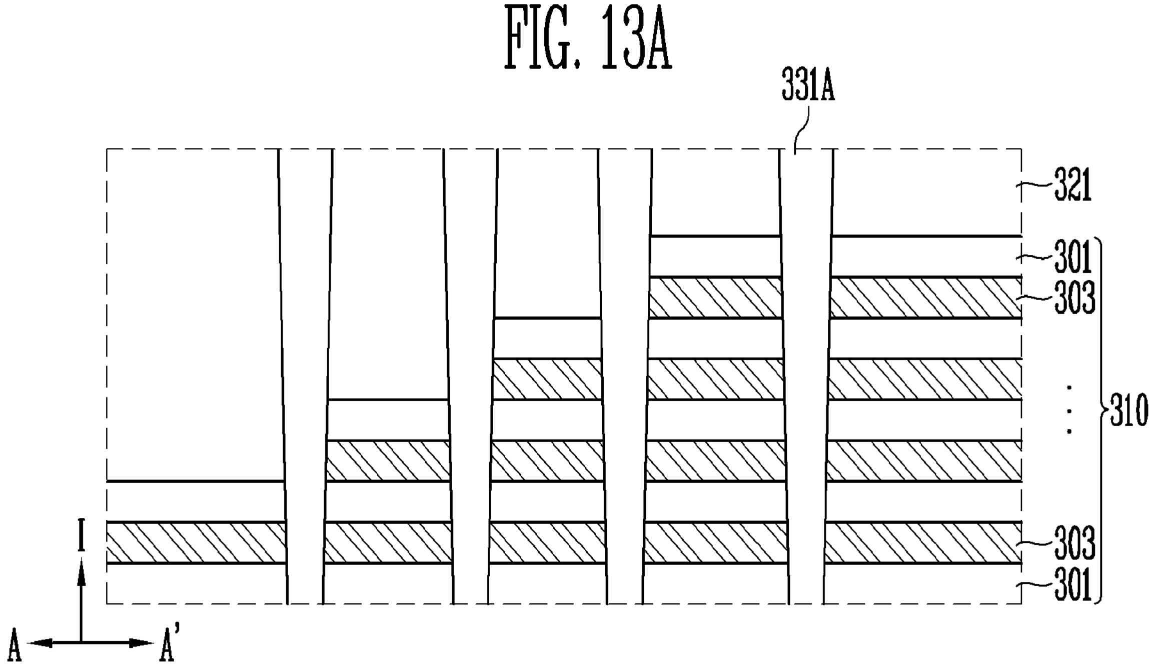
FIGS. 13A to 13C are sectional views illustrating process ST9 shown in FIG. 12.
Figure 13B:
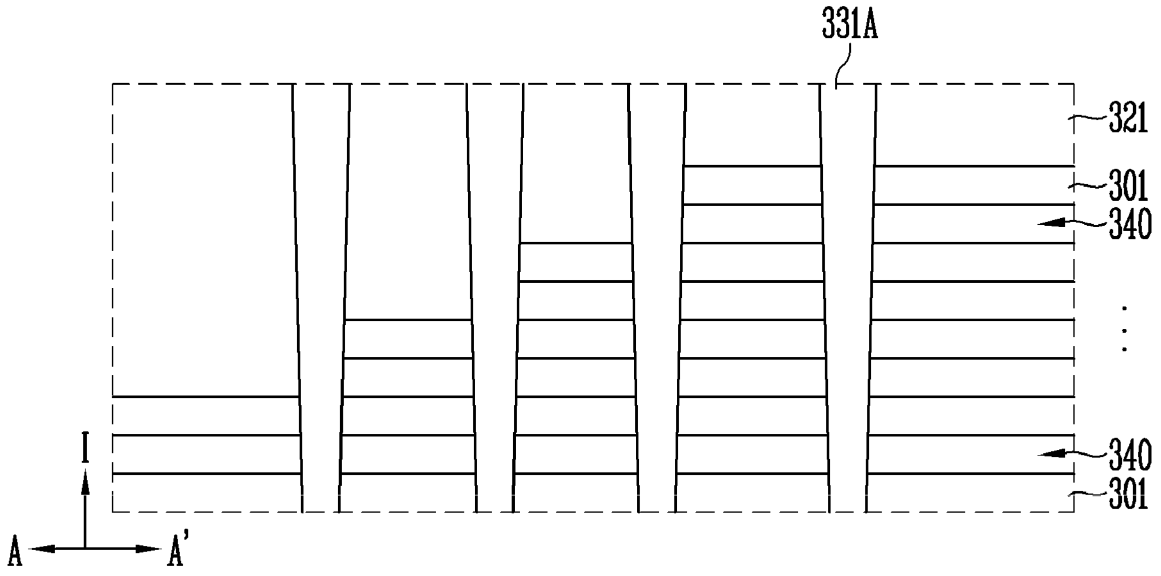
Figure 13C:
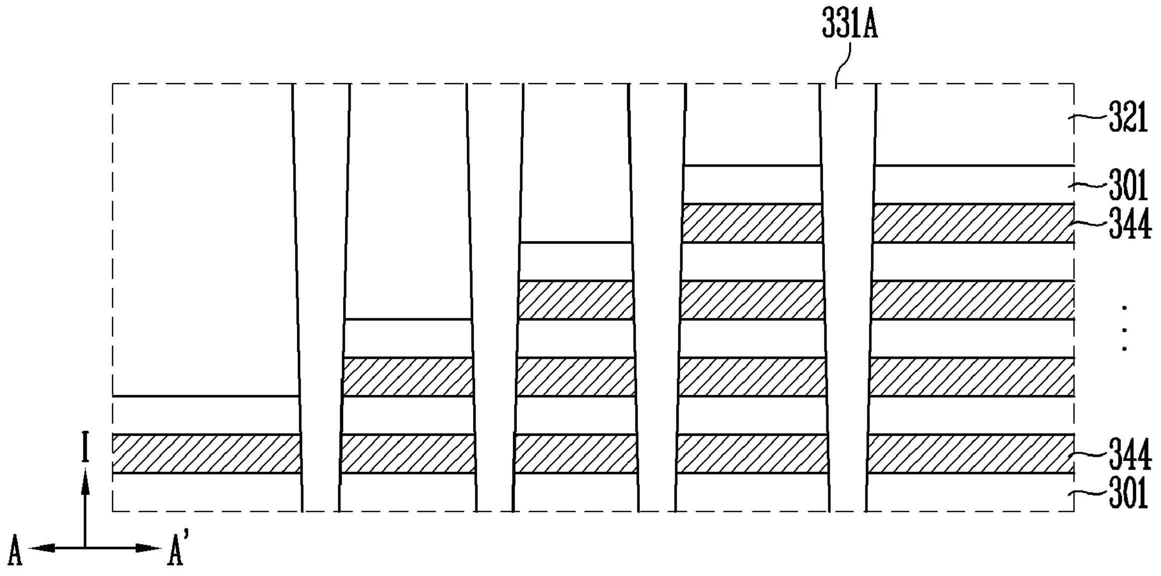

FIGS. 13A to 13C are sectional views illustrating the process ST9 shown in FIG. 12.

Referring to FIG. 13A, after a stack structure 310 including interlayer insulating layers 301 and sacrificial layers 303, which are alternately stacked, is etched to define a stepped structure, an upper insulating layer 321 covering the stepped structure may be formed. Insulating patterns including supporting structures 331A may be formed to penetrate the upper insulating layer 321 and the stack structure 310. The sacrificial layers 303 may be exposed by the slits formed in the process ST7 described with reference to FIG. 12.

Referring to FIG. 13B, the sacrificial layers 303 shown in FIG. 13A may be removed through the slits described with reference to FIG. 12. Accordingly, spaces between the interlayer insulating layers 301 may be opened such that interlayer spaces 340 are defined. By supporting through the supporting structures 331A, deformation of the opened interlayer spaces 340 may be reduced.

Referring to FIG. 13C, electrode patterns 344 may be formed by filling the interlayer spaces 340 shown in FIG. 13B with a conductive material.

In FIGS. 13A to 13C, the process of replacing the sacrificial layers of the stack structure including the interlayer insulating layers and the sacrificial layers with the electrode patterns is illustrated as an embodiment, but the present disclosure is not limited thereto. For example, the sacrificial layers of the stack structure including the sacrificial layers and the electrode patterns may be replaced with the interlayer insulating layers through the slits.

Figure 14:
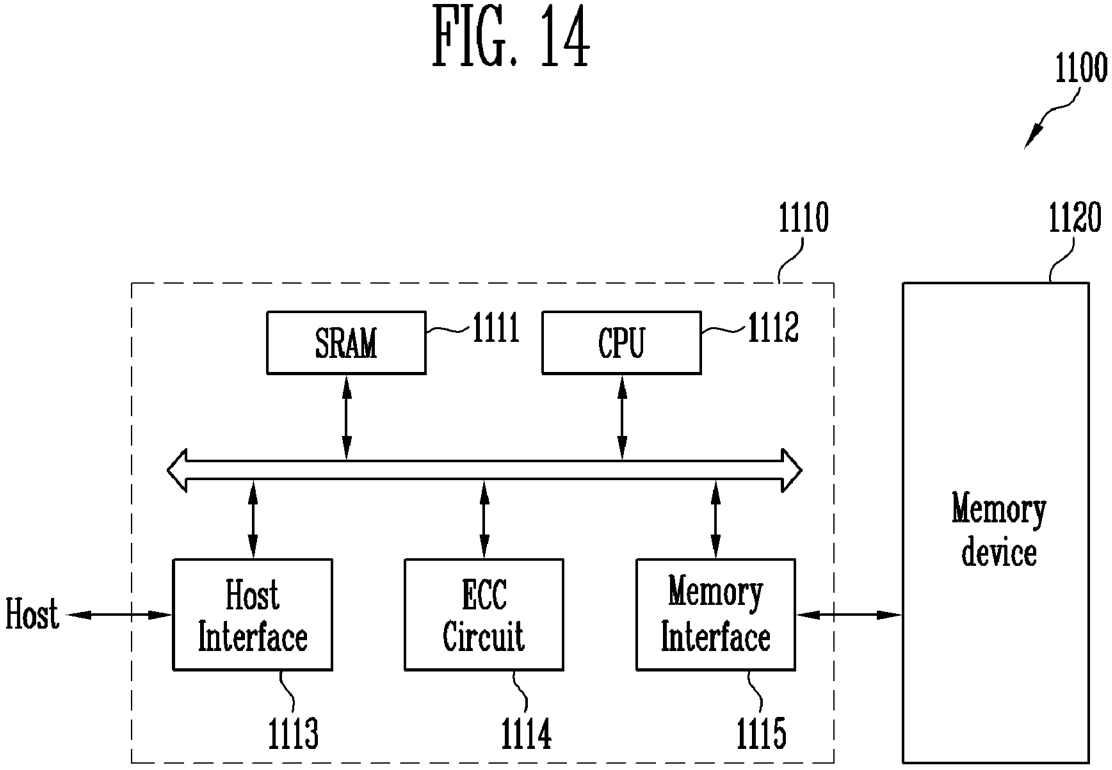
FIG. 14 is a block diagram illustrating a configuration of a memory system in accordance with an embodiment of the present disclosure.

FIG. 14 is a block diagram illustrating a configuration of a memory system in accordance with an embodiment of the present disclosure.

Referring to FIG. 14, the memory system 1100 includes a memory device 1120 and a memory controller 1110.

The memory device 1120 may be a multi-chip package configured with a plurality of flash memory chips. The memory device 1120 may include insulating patterns having various cross-sectional structures as described with reference to FIGS. 5, 6, 7A to 7E, 8A to 8E, 9A to 9E, and 11A and 11B. In addition, the insulating patterns may have various longitudinal sectional structures as described with reference to FIGS. 10A and 10B.

The memory controller 1110 is configured to control the memory device 1120, and may include a static random access memory (SRAM) 1111, a CPU 1112, a host interface 1113, an error correction code (ECC) circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 15:
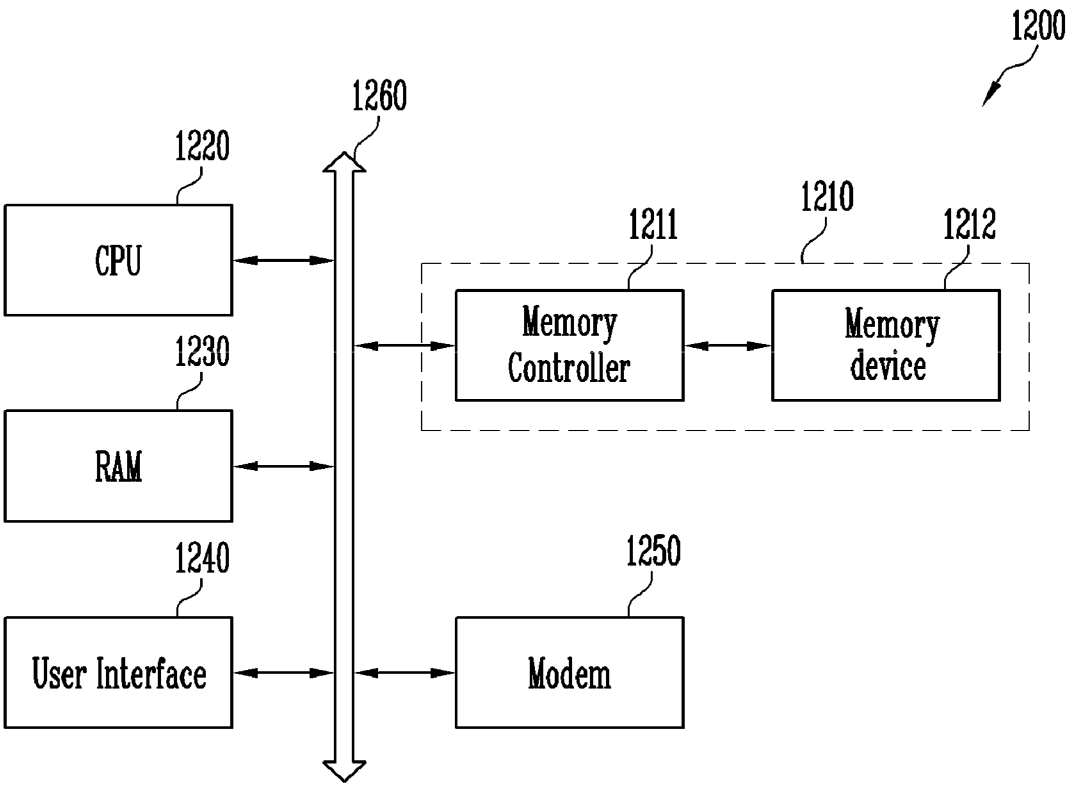
FIG. 15 is a block diagram illustrating a configuration of a computing system in accordance with an embodiment of the present disclosure.

FIG. 15 is a block diagram illustrating a configuration of a computing system in accordance with an embodiment of the present disclosure.

Referring to FIG. 15, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

In accordance with the present disclosure, a supporting structure is formed to have a structure extending in a zigzag shape, or is formed to have a bent part surrounding a contact plug, so that the supporting force of the supporting structure may be improved. Accordingly, the structural stability of a three-dimensional semiconductor device may be improved.

A limited number of embodiments of the present disclosure have been illustrated and described in the drawings and specification. Although specific terminologies are used here, those terminologies are to explain the presented embodiments. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideal or excessively formal way.

What is claimed is:

1. A semiconductor device comprising:
- a stack structure including alternately stacked interlayer insulating layers and electrode patterns;
- a plurality of contact plugs connected to the electrode patterns; and
- a supporting structure, among a plurality of supporting structures, penetrating the stack structure between two adjacent contact plugs of the plurality of contact plugs,
- wherein the supporting structure, among the plurality of supporting structures, has a cross section with a zigzag shape.

2. The semiconductor device of claim 1, wherein the supporting structure comprises:
- a first material layer penetrating the stack structure; and
- a second material layer surrounded by the first material layer,
- wherein the first material layer has tensile strength greater than that of the second material layer, and
- wherein the second material layer has compressive strength greater than that of the first material layer.

3. The semiconductor device of claim 1, wherein the supporting structure comprises:
- a first material layer penetrating the stack structure; and
- a second material layer surrounded by the first material layer,
- wherein the second material layer has tensile strength greater than that of the first material layer, and
- wherein the first material layer has compressive strength greater than that of the second material layer.

4. The semiconductor device of claim 1, wherein the supporting structure comprises:
- a first material layer penetrating the stack structure; and
- a second material layer surrounded by the first material layer,
- wherein one of the first material layer and the second material layer comprises silicon oxide ($SiO_2$), and the other of the first material layer and the second material layer comprises at least one of aluminum oxide ($Al_2O_3$), silicon carbide (SiC), boron carbide ($B_4C$), and silicon nitride ($Si_3N_4$).

5. The semiconductor device of claim 1, further comprising block separation patterns formed on a sidewall of the stack structure, wherein the block separation patterns face each other,
- wherein each of the block separation patterns comprises:
- a first material layer; and
- a second material layer surrounded by the first material layer,
- wherein the first material layer has tensile strength greater than that of the second material layer, and
- the second material layer has compressive stress greater than that of the first material layer.

6. The semiconductor device of claim 1, further comprising block separation patterns formed on a sidewall of the stack structure, wherein the block separation patterns face each other,
- wherein each of the block separation patterns comprises:
- a first material layer; and
- a second material layer surrounded by the first material layer,
- wherein the second material layer has tensile strength greater than that of the first material layer, and
- the first material layer has compressive stress greater than that of the second material layer.

7. The semiconductor device of claim 1, further comprising block separation patterns formed on a sidewall of the stack structure, wherein the block separation patterns face each other,
- wherein each of the block separation patterns comprises:
- a first material layer; and
- a second material layer surrounded by the first material layer,
- wherein one of the first material layer and the second material layer comprises silicon oxide ($SiO_2$), and the other of the first material layer and the second material layer comprises at least one of aluminum oxide ($Al_2O_3$), silicon carbide (SiC), boron carbide ($B_4C$), and silicon nitride ($Si_3N_4$).

8. The semiconductor device of claim 1, wherein the supporting structure is formed in an "S" shape.

9. A semiconductor device comprising:
- a stack structure including alternately stacked interlayer insulating layers and electrode patterns;
- a plurality of contact plugs connected to the electrode patterns;
- a supporting structure penetrating the stack structure between two adjacent contact plugs of the plurality of contact plugs, wherein the supporting structure has a cross section extending in a zigzag shape; and
- slits extending in parallel to each other and penetrating the stack structure, wherein the contact plugs and the supporting structure are interposed between the slits,
- wherein the supporting structure includes:
- a first part extending in a direction oblique to a direction in which the slits extend; and
- second and third parts extending from the first part in opposite directions,
- wherein the opposite directions in which the second part and the third part extend are oblique to the direction in which the slits extend and oblique to the direction in which the first part extends.

10. A semiconductor device comprising:
- a stack structure including alternately stacked interlayer insulating layers and electrode patterns;
- a supporting structure penetrating the stack structure, wherein the supporting structure includes a bent part; and
- a contact plug connected to one of the electrode patterns, wherein the contact plug is partially surrounded by the bent part.

11. The semiconductor device of claim 10, wherein the supporting structure is formed in an "H" shape or an "X" shape.

12. The semiconductor device of claim 10, wherein the supporting structure comprises:
- a first material layer; and
- a second material layer surrounded by the first material layer, wherein the first material layer has tensile strength greater than that of the second material layer, and wherein the second material layer has compressive strength greater than that of the first material layer.

13. The semiconductor device of claim 10, wherein the supporting structure comprises:

a first material layer; and a second material layer surrounded by the first material layer, wherein the second material layer has tensile strength greater than that of the first material layer, and wherein the first material layer has compressive strength greater than that of the second material layer.

14. The semiconductor device of claim 10, wherein the supporting structure comprises:

a first material layer; and a second material layer surrounded by the first material layer, wherein one of the first material layer and the second material layer comprises silicon oxide ($SiO_2$), and the other of the first material layer and the second material layer comprises at least one of aluminum oxide ($Al_2O_3$), silicon carbide (SiC), boron carbide ($B_4C$), and silicon nitride ($Si_3N_4$).

15. The semiconductor device of claim 10, further comprising block separation patterns formed on a sidewall of the stack structure, wherein the block separation patterns face each other, wherein each of the block separation patterns comprises:

a first material layer; and a second material layer surrounded by the first material layer, wherein the first material layer has tensile strength greater than that of the second material layer, and wherein the second material layer has compressive strength than that of the first material layer.

16. The semiconductor device of claim 10, further comprising block separation patterns formed on a sidewall of the stack structure, wherein the block separation patterns face each other, wherein each of the block separation patterns comprises:

a first material layer; and a second material layer surrounded by the first material layer, wherein the second material layer has tensile strength greater than that of the first material layer, and wherein the first material layer has compressive strength than that of the second material layer.

17. The semiconductor device of claim 10, further comprising block separation patterns formed on a sidewall of the stack structure, wherein the block separation patterns face each other, wherein each of the block separation patterns comprises:

a first material layer; and a second material layer surrounded by the first material layer, wherein one of the first material layer and the second material layer comprises silicon oxide ($SiO_2$), and the other of the first material layer and the second material layer comprises at least one of aluminum oxide ($Al_2O_3$), silicon carbide (SiC), boron carbide ($B_4C$), and silicon nitride ($Si_3N_4$).

* * * * *